(12) United States Patent
Yuan et al.

(10) Patent No.: US 8,632,897 B2
(45) Date of Patent: Jan. 21, 2014

(54) MULTILAYER HARD MAGNET AND DATA STORAGE DEVICE READ/WRITE HEAD INCORPORATING THE SAME

(75) Inventors: Hua Yuan, Milpitas, CA (US); Jiaoming Qiu, St. Paul, MN (US); Yonghua Chen, Edina, MN (US); Shaun Eric McKinlay, Eden Prairie, MN (US); Eric Walter Singleton, Maple Plain, MN (US)

(73) Assignee: Seagate Technology LLC, Cupertino, CA (US)

( * ) Notice: Subject to any disclaimer, the term of this patent is extended or adjusted under 35 U.S.C. 154(b) by 417 days.

(21) Appl. No.: 12/607,897

(22) Filed: Oct. 28, 2009

(65) Prior Publication Data

US 2010/0047627 A1 Feb. 25, 2010

Related U.S. Application Data

(63) Continuation-in-part of application No. 12/112,671, filed on Apr. 30, 2008.

(51) Int. Cl.
*G11B 5/31* (2006.01)
*B32B 15/00* (2006.01)

(52) U.S. Cl.
USPC ........ 428/812; 428/815; 428/682; 428/692.1; 428/693.1

(58) Field of Classification Search
None
See application file for complete search history.

(56) References Cited

U.S. PATENT DOCUMENTS

| | | | |
|---|---|---|---|
| 5,363,794 A | | 11/1994 | Lairson |
| 5,591,515 A | * | 1/1997 | Osato ........................... 428/212 |
| 5,729,410 A | | 3/1998 | Fontana, Jr. et al. |
| 5,824,409 A | | 10/1998 | Sellmyer et al. |
| 5,958,575 A | * | 9/1999 | Fijimoto et al. ............ 428/819.1 |
| 6,139,907 A | * | 10/2000 | Sellmyer et al. ............... 148/518 |
| 6,605,321 B1 | | 8/2003 | Ravelosona-Ramasitera |
| 6,666,930 B2 | | 12/2003 | Aoyama |
| 6,756,239 B1 | | 6/2004 | Nickel et al. |
| 7,056,605 B2 | * | 6/2006 | Kawada ....................... 428/832.1 |
| 7,128,987 B2 | * | 10/2006 | van de Veerdonk et al. .. 428/828 |
| 7,446,987 B2 | | 11/2008 | Zhang |

(Continued)

FOREIGN PATENT DOCUMENTS

JP  05029172 A  *  2/1993
JP  2009-087474     4/2009

OTHER PUBLICATIONS

JPO Abstract Translation of JP 05-029172 A (JPO Pat-No. JP405029172A), patent published 1993.*
Machine Translation of JP 05-029172 A (Patent published 1993).*

(Continued)

*Primary Examiner* — Kevin Bernatz
(74) *Attorney, Agent, or Firm* — Mueting Raasch & Gebhardt

(57) ABSTRACT

A hard magnet may include a seed layer including a first component including at least one of a Pt-group metal, Fe, Mn, and Co, a cap layer comprising the first component, and a multilayer stack between the seed layer and the cap layer. In some embodiments, the multilayer stack may include a first layer of including the first component and a second component including at least one of a Pt-group metal, Fe, Mn, and Co, where the second component is different than the first component. The multilayer stack may further include a second layer formed over the first layer and including the second component, and a third layer formed over the second layer and including the first component and the second component.

17 Claims, 18 Drawing Sheets

(56) References Cited

U.S. PATENT DOCUMENTS

| | | | |
|---|---|---|---|
| 2002/0101689 A1 | 8/2002 | Tang et al. | |
| 2005/0135020 A1* | 6/2005 | Sugita et al. | 360/324 |
| 2005/0271901 A1* | 12/2005 | Noma et al. | 428/812 |
| 2006/0012905 A1 | 1/2006 | Okino et al. | |
| 2006/0193089 A1 | 8/2006 | Li et al. | |
| 2009/0274931 A1* | 11/2009 | Qiu et al. | 428/814 |
| 2010/0200124 A1* | 8/2010 | Qiu et al. | 148/527 |

OTHER PUBLICATIONS

Yan et al., "Highly Oriented Nonepitaxially Grown L10 FePt Film", May 15, 2003, Journal of App. Phys. vol. 93, No. 10, p. 8292-8294.

Kuo, "Microstructure and magnetic properties of Fe100-xPt x alloy films," Journal of Applied Physics, vol. 85. No. 4, Feb. 15, 1999, 2264-2269.

Office Action from U.S. Appl. No. 12/112,671, dated May 27, 2010, 11 pp.

Response to Office Action dated May 27, 2010, from U.S. Appl. No. 12/112,671, filed Aug. 27, 2010, 9 pp.

Chen et al., "Largely Enhanced Coercivity of FePt Film at Low Temperature by Introduction of CrRu Underlayer," Journal of Magnetism and Magnetic Materials, 310, e921-e923, 2007.

Dodrill, "Magnetic Media Measurements with a VSM," Lake Shore Cryotronics, Inc., www.lakeshore.com, 10 pages, printed on Jun. 5, 2006.

The Penguin Dictionary of Chemistry, Edited by D.W.A. Sharp, M.A., Ph.D., Second Edition, 1983, 1990 Penguin Books, definition of "platinum metals", p. 318.

Hawley's Condensed Chemical Dictionary, Thirteenth Division, Revised by Richard J. Lewis, Sr., 1997 John Wiley & Sons, Inc. ,definition of "platinum metal", p. 890.

* cited by examiner

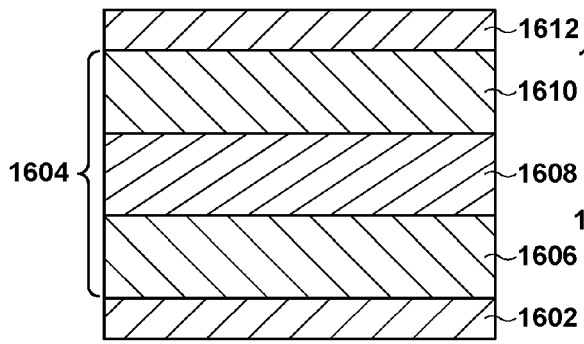
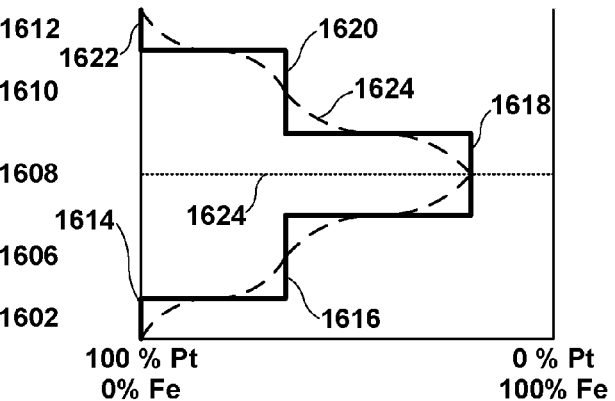
FIG. 16A  FIG. 16B
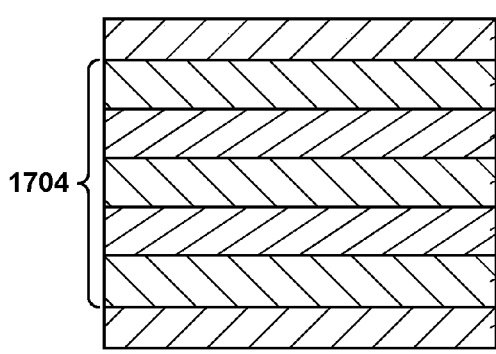
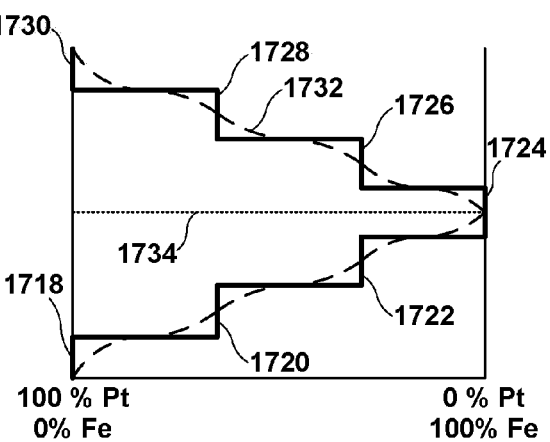
FIG. 17A  FIG. 17B

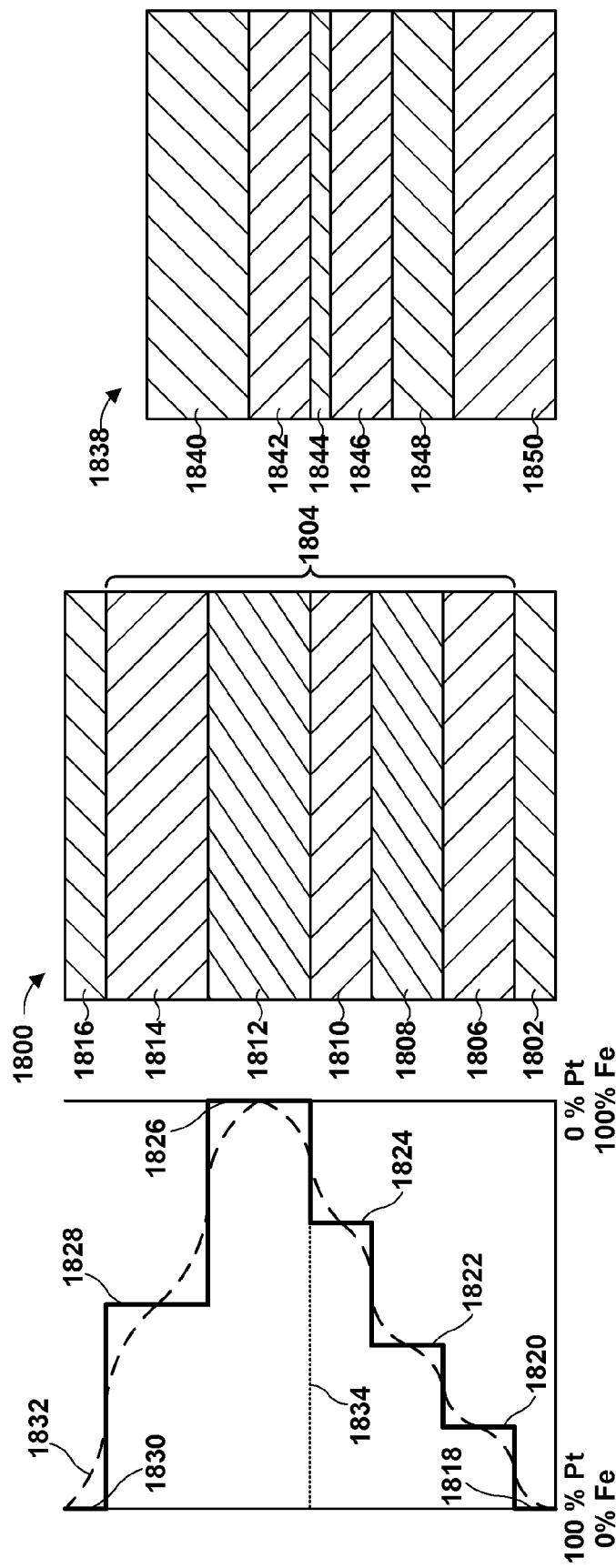

US 8,632,897 B2

MULTILAYER HARD MAGNET AND DATA STORAGE DEVICE READ/WRITE HEAD INCORPORATING THE SAME

This application is a continuation-in-part of U.S. patent application Ser. No. 12/112,671, filed Apr. 30, 2008, the entire content of which is incorporated herein by reference.

BACKGROUND

Magnetic data storage devices include magnetic read/write heads, which detect and modify the magnetic properties of a magnetic storage medium. For example, the read/write head includes a magnetoresistive sensor that changes resistance in response to an applied magnetic field. Based on this change in resistance, the read/write head senses or modifies the magnetic properties of the magnetic storage medium.

SUMMARY

In one aspect, the disclosure is directed to a hard magnet including a seed layer including a first component including at least one of a Pt-group metal, Fe, Mn, and Co, a cap layer comprising the first component, and a multilayer stack between the seed layer and the cap layer. According to this aspect of the disclosure, the multilayer stack may include a first layer of including the first component and a second component including at least one of a Pt-group metal, Fe, Mn, and Co, where the second component is different than the first component. The multilayer stack may further include a second layer formed over the first layer and including the second component, and a third layer formed over the second layer and including the first component and the second component.

The details of one or more embodiments of the invention are set forth in the accompanying drawings and the description below. These and various other features and advantages will be apparent from a reading of the following detailed description.

BRIEF DESCRIPTION OF DRAWINGS

FIGS. 16A and 16B are a cross-sectional diagram and a plot of composition for an example multilayer hard magnet.

FIGS. 17A and 17B are a cross-sectional diagram and a plot of composition for an example multilayer hard magnet.

FIGS. 18A and 18B are a cross-sectional diagram and a plot of composition for an example multilayer hard magnet.

FIG. 18C is a cross-sectional diagram of an example read sensor.

DETAILED DESCRIPTION

The present disclosure is generally directed to magnetic materials for use in data storage applications. In some embodiments, the magnetic materials may be used in a read/write head for a magnetic data storage device. The magnetic materials may be formed from an alloy including platinum (Pt) and iron (Fe), for example, and may be formed by a low-temperature annealing of the alloy, a seed layer and a cap layer. The magnetic materials preferably include a $L1_0$ phase constitution, and have a desirably high coercivity and a large saturation magnetization.

In some embodiments, the magnetic materials may formed as a multilayer hard magnet. For example, the multilayer hard magnet may include a seed layer, a cap layer, and a multilayer stack between the seed layer and cap layer. The multilayer stack may include at least two layers, and the layers may include different compositions. For example, the multilayer stack may include a plurality of layers that result in a compositional gradient, which may be symmetric about a plane approximately equidistant from and substantially parallel to the seed and cap layers, or may be asymmetric about the plane approximately equidistant from and substantially parallel to the seed and cap layers. In some embodiments, the multilayer stack may provide a magnet having a magnetic moment that is different in different portions of the magnet.

While the present disclosure discusses the use of the magnetic materials as biasing magnets in a read/write head for a disc drive, the magnetic materials may also be useful in other applications where a magnetic material with high coercivity and relatively small magnetic grain sizes are desired. For example, the magnetic materials described herein may be useful for magnetic media.

Figure 1:
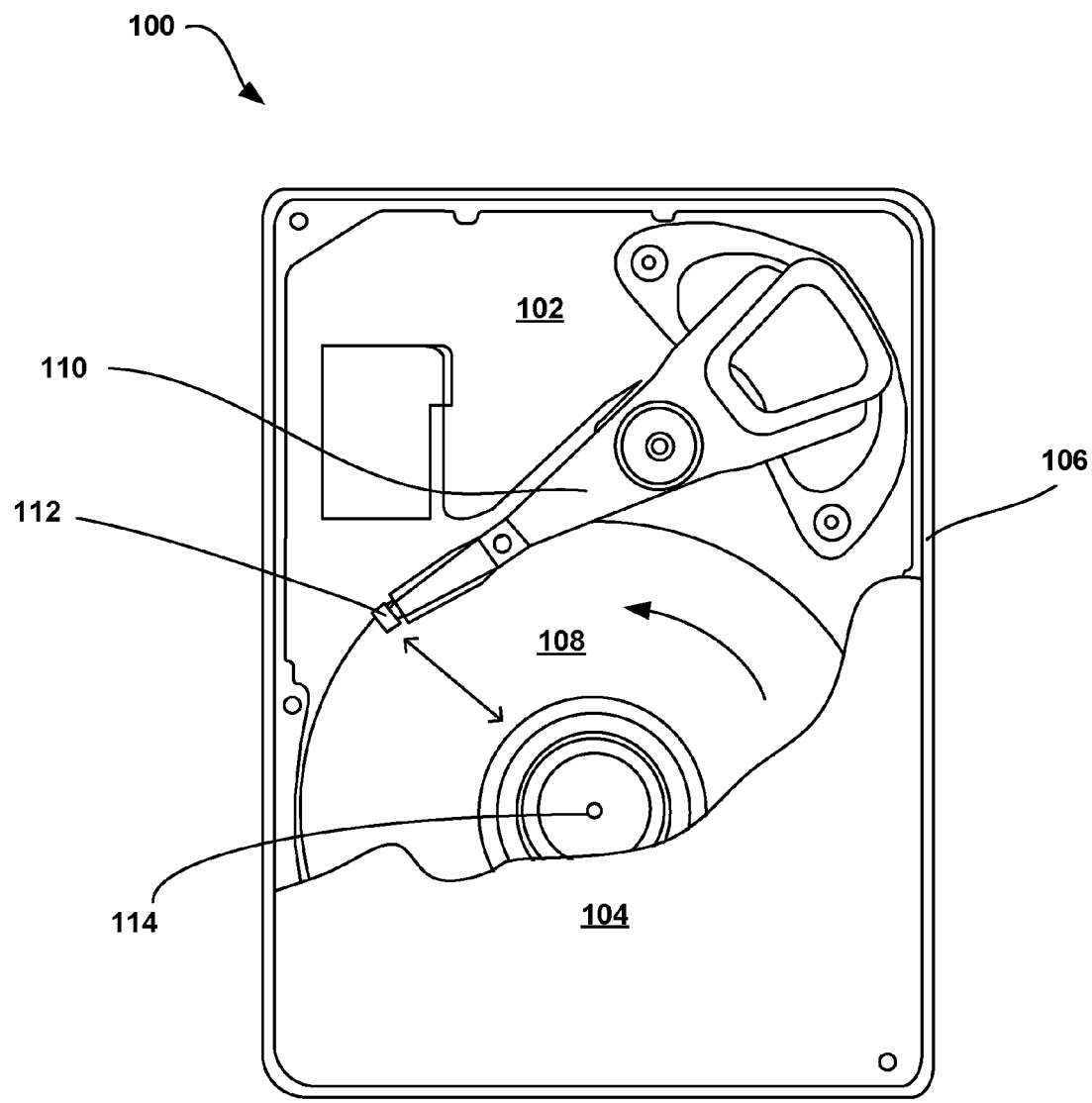
FIG. 1 is a schematic diagram of a hard disc drive.

FIG. 1 illustrates an exemplary magnetic disc drive 100 including a read/write head according to one aspect of the present disclosure. Disc drive 100 includes base 102 and top cover 104, shown partially cut away. Base 102 combines with top cover 104 to form the housing 106 of disc drive 100. Disc drive 100 also includes one or more rotatable magnetic data discs 108. Data discs 108 are attached to spindle 114, which operates to rotate discs 108 about a central axis. Magnetic recording and read head 112 is adjacent to data discs 108. Actuator arm 110 carries magnetic recording and read head 112 for communication with each of data discs 108.

Data discs 108 store information as magnetically oriented bits on a magnetic film. Magnetic read/write head 112 includes a recording (write) head that generates magnetic fields sufficient to magnetize discrete domains of the magnetic film on data discs 108. These discrete domains of the magnetic film each represent a bit of data, with one magnetic orientation representing a "0" and a substantially opposite magnetic orientation representing a "1." Magnetic recording and read head 112 also includes a read head that is capable of detecting the magnetic fields of the discrete magnetic domains of the magnetic film.

Figure 2:
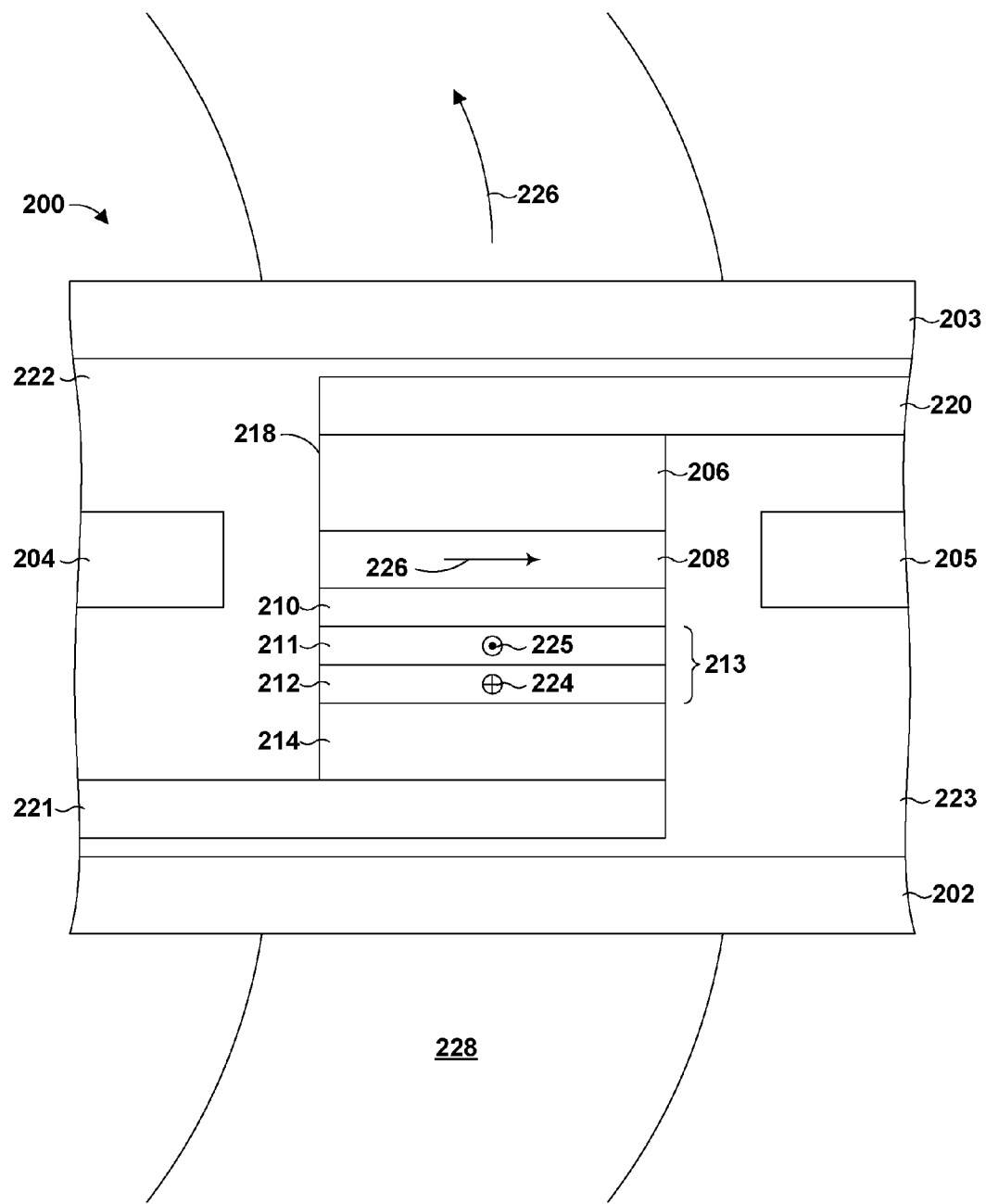
FIG. 2 is a block diagram illustrating a hard disc read head including a tunneling magneto-resistance sensor.

FIG. 2 is a schematic block diagram illustrating an embodiment of a hard disc read head 200 that may be used with magnetic read/write head 112 in FIG. 1. Read head 200 utilizes magneto-resistance to read data from data discs, such as data discs 108 of FIG. 1. While the precise nature of read head 200 may vary widely, a tunneling magneto-resistance read head will be described as one example of a read head 200 in which the disclosed magnetic materials may be utilized. It will be understood, though, that the magnetic materials described herein may be used in any read head 200, such as, for example, a current perpendicular-to-the-plane giant magneto-resistive head, a giant magneto-resistive head, or the like. Furthermore, the magnetic materials may find use in many other applications where a high coercivity and/or a large saturation magnetization are desired.

Referring again to FIGS. 1-2, read head 200 flies over the surface of data discs 108 on an air bearing created by the rotation of data discs 108. Data discs 108 have a plurality of data tracks 228, one of which is shown in FIG. 2. Data tracks 228 may be divided into a plurality of bits. As disc 108 rotates, as indicated by arrow 226, read head 200 follows a data track 228 and may read each bit of the data track 228 as it passes under sensor 218.

Read head 200 includes a first shield layer 202 and a second shield layer 203, a tunneling magneto-resistive sensor 218 and two hard magnets 204, 205. First and second shield layers 202, 203 reduce or substantially block extraneous magnetic fields, such as, for example, those from adjacent bits on data discs 108 from impacting sensor 218, thus improving the performance of sensor 218. Ideally, first and second shield layers 202, 203 permit magnetic fields from only the bit directly under sensor 218 to affect sensor 218, and thus be read. Thus, as the physical size of bits continues to decrease, the shield-to-shield spacing may also continue to decrease.

Sensor 218 includes a plurality of layers, including an antiferromagnetic seed layer 214, a pinned layer 212, a reference layer 211, a tunneling barrier layer 210, a free layer 208 and a cap layer 206. Antiferromagnetic layer 214 is electrically coupled to a first electrode 221, and cap layer 206 is electrically coupled to a second electrode 220. Pinned layer 212 is formed on and exchange coupled to antiferromagnetic layer 214. The exchange coupling fixes the magnetic moment of pinned layer 212 in a known orientation. Likewise, the magnetic moment of pinned layer 212 induces a substantially antiparallel magnetic field in reference layer 211. Together, pinned layer 212 and reference layer 211 form a synthetic antiferromagnet 213. The magnetic moments of each of pinned layer 212 and reference layer 211 are not allowed to rotate under magnetic fields in the range of interest (e.g., magnetic fields generated by the bits of data stored on data discs 108). The magnetic moments of reference layer 211 and pinned layer 212 are generally oriented normal to the plane of FIG. 2 and antiparallel to each other, as indicated by arrow tail 224 and arrow head 225 (e.g., into and out of the plane of FIG. 2).

Sensor 218 also includes a free layer 208, which is not exchange coupled to an antiferromagnet. Thus, the magnetic moment of free layer 208 is free to rotate under the influence of an applied magnetic field in the range of interest.

Read head 200 further includes a pair of bias magnets 204 and 205, which produce a magnetic field that biases free layer 208 with a magnetic moment parallel to the plane of the figure and generally oriented horizontally, as indicated by arrow 226. This bias prevents the magnetic moment of free layer 208 from drifting due to, for example, thermal energy, which may introduce noise into the data sensed by the read head 200. The bias is sufficiently small, however, that the magnetic moment of free layer 208 can change in response to an applied magnetic field, such as a magnetic field of a data bit stored on data discs 108. Sensor 218 and electrodes 220, 221 are separated and electrically isolated from bias magnets 204, 205 by insulating materials 222, 223, respectively.

Tunneling barrier layer 210 separates free layer 208 and reference layer 211. Tunneling barrier layer 210 is sufficiently thin that quantum mechanical electron tunneling occurs between reference layer 211 and free layer 208. The electron tunneling is electron-spin dependent, making the magnetic response of sensor 218 a function of the relative orientations and spin polarizations of reference layer 211 and free layer 208. The highest probability of electron tunneling occurs when the magnetic moments of reference layer 211 and free layer 208 are parallel, and the lowest probability of electron tunneling occurs when the magnetic moments of reference layer 211 and free layer 208 are antiparallel. Accordingly, the electrical resistance of sensor 218 changes in response to an applied magnetic field. The data bits on discs 108 are magnetized in a direction normal to the plane of FIG. 2, either into the plane of the figure, or out of the plane of the figure. Thus, when sensor 218 passes over a data bit, the magnetic moment of free layer 208 rotates either into the plane of FIG. 2 or out of the plane of FIG. 2 in response to the magnetic field produced by a bit passing under sensor 218, changing the electrical resistance of sensor 218. The value of the bit being sensed by sensor 218 (e.g., either 1 or 0) may therefore be determined based on the current flowing from first electrode 221 to second electrode 220.

Figure 3:
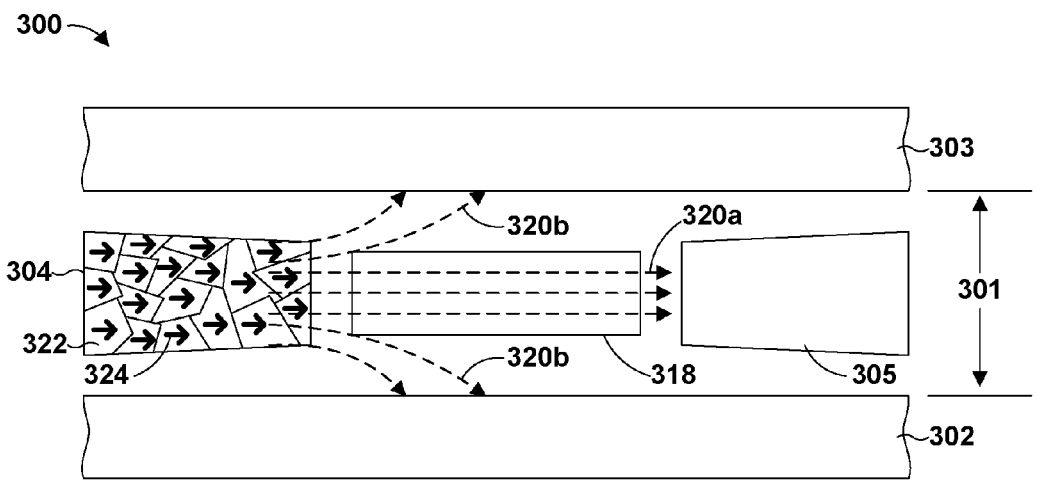
FIG. 3 is a block diagram illustrating a hard disc read head.
Figure 4:
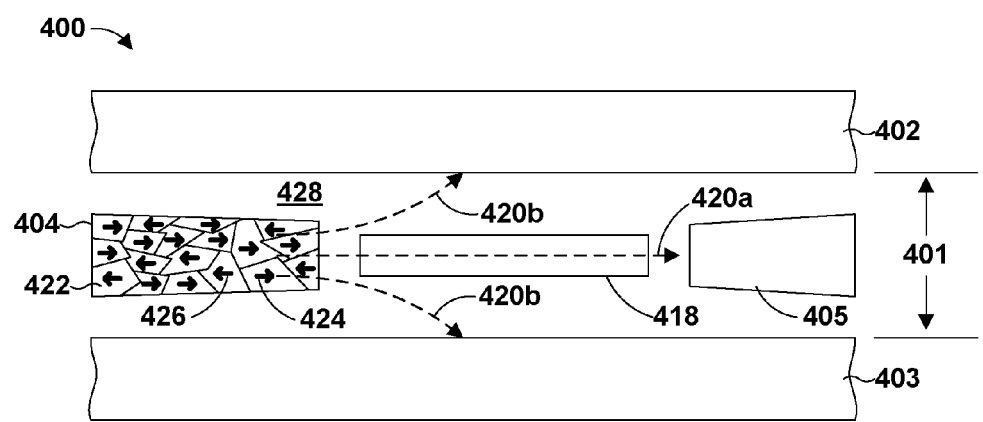
FIG. 4 is a block diagram illustrating another hard disc read head.

To increase the storage capacity of a magnetic data storage device such as a disc drive, the size of the magnetically oriented domains (bits) on the data discs 108 is continually being made smaller to produce higher data densities. Accordingly, the size of read head 200 may continually be made smaller, and particularly, the shield-to-shield spacing may be decreased, so that the sensor 218 is substantially isolated from the magnetic fields of adjacent bits on data discs 108. FIGS. 3 and 4 illustrate example complications that may occur when the shield-to-shield spacing is decreased.

FIG. 3 shows an embodiment of a read head 300 including a first shield 302 and a second shield 303 separated by a distance 301. Read head 300 includes a sensor 318, a first biasing magnet 304 and a second biasing magnet 305, similar to read head 200. The layers of sensor 318 are not shown in FIG. 3 for the sake of clarity. First biasing magnet 304 includes a plurality of magnetized domains 322, each with a magnetization direction represented by arrows 324. First biasing magnet 304 produces a magnetic field represented by flux lines 320a and 320b (collectively, "flux lines 320"). As is shown, some of the flux lines 320b are not emitted in the plane of magnets 304, 305 and sensor 318, but instead intersect one of shield 302 or shield 303. These flux lines represent an amount of the magnetic field produced by first biasing magnet 304 that does not contribute to the biasing of the free layer of sensor 318. Flux lines 320a, however, travel through sensor 318. At least some of this portion of the magnetic field contributes to the biasing of the free layer of sensor 318 in the horizontal direction (i.e., parallel to flux lines 320a).

FIG. 4, then, shows a read head 400 that includes a smaller shield-to-shield spacing 401, which may be used to read smaller magnetized domains on data discs 108. In the embodiment shown in FIG. 4, the sizes of biasing magnets 404, 405 are shown as being smaller compared to those in FIG. 3, as is sensor 418. However, this may not be true in all embodiments. For example, in some embodiments, only the thickness of insulating material 428 may be made smaller, while biasing magnets 404, 405 and sensor 418 remain the same size.

Regardless whether the sizes of biasing magnets 404, 405 and sensor 418 are smaller, the reduction in shield-to-shield spacing 401 results in a larger portion of the magnetic field generated by biasing magnet 404 encountering one of first shield 402 or second shield 403, as is represented by flux lines 420b. The increased portion of the magnetic field encountering one of shields 402, 403 results in a smaller portion of the field being available for biasing the free layer (not shown in FIG. 4), represented by single flux line 420a. Because of this lower bias, the signal-to-noise ratio of sensor 418 may be lower than the signal-to-noise ratio of sensor 318, which is disadvantageous.

FIGS. 3-4 illustrate another complication that may occur with a smaller read head 400. For example, biasing magnet 404 includes smaller magnetic grains 422 relative to the magnetic grains 322 of biasing magnet 304. The smaller magnetic grains 422 result in a higher probability that the thermal energy present in the system will cause the magnetic moment of an individual grain 422 to reorient itself, as indicated by arrow 426. The reorientation of the magnetic moments of the individual magnetic grains 422 may decrease the overall magnetic moment of biasing magnet 404, and over time may in fact decrease the magnetic moment significantly.

Accordingly, bias magnets 404, 405 with a higher saturation magnetization and coercivity are desired. The higher magnetization may increase the magnetic flux of bias magnets 404, 405 that is useful for biasing the free layer, and the higher coercivity may increase the stability of the magnetization. This may in turn facilitate the use of smaller sensors (e.g., sensor 418) in read head 400 of a hard disc drive (e.g., disc drive 100).

Alloys including iron and a platinum group metal may provide a relatively high coercivity and magnetic moment. The Pt-group metal may be selected from, for example, Pt, Pd, Ir, Rh and Ru, or combinations thereof. Pt-group metals including Pt are preferred, and Pt is particularly preferred.

The alloys may also include other elements in a minority amount, such as, for example, copper, gold, silver and the like. However, to provide high coercivity and high magnetic moment, the iron-platinum alloy should preferably include a high-anisotropy $L1_0$, or face centered tetragonal (FCT), phase constitution.

Figure 5:
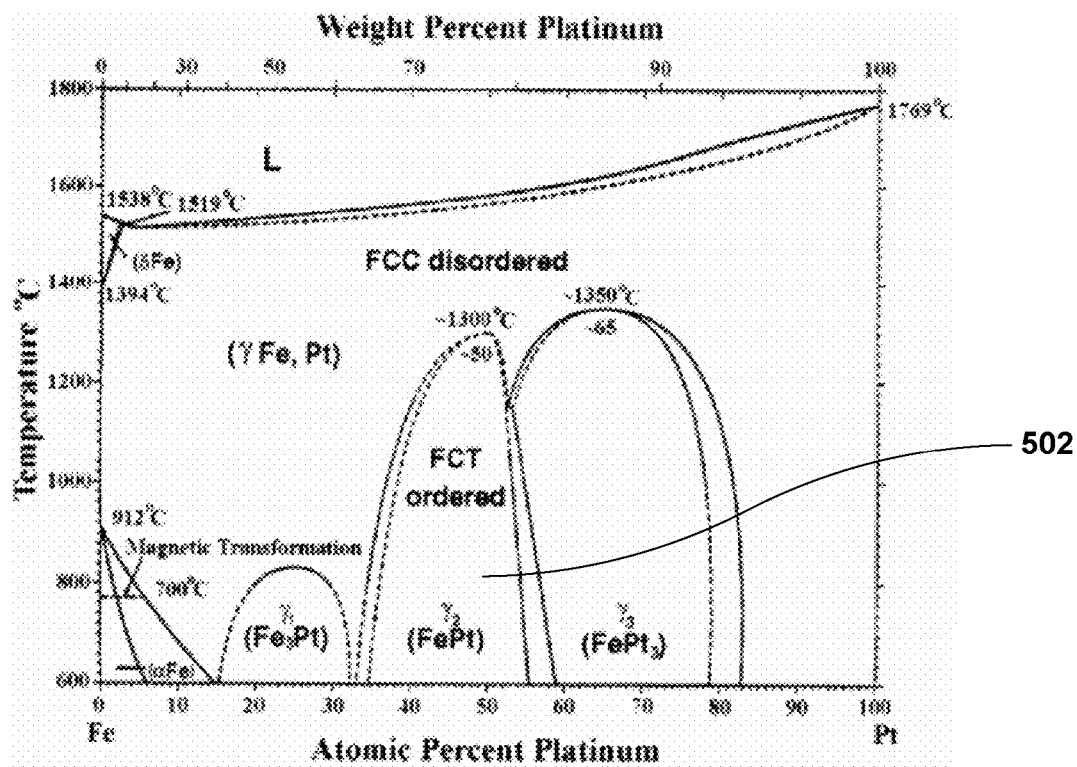
FIG. 5 is a phase diagram for a platinum-iron binary system.
Figure 6:
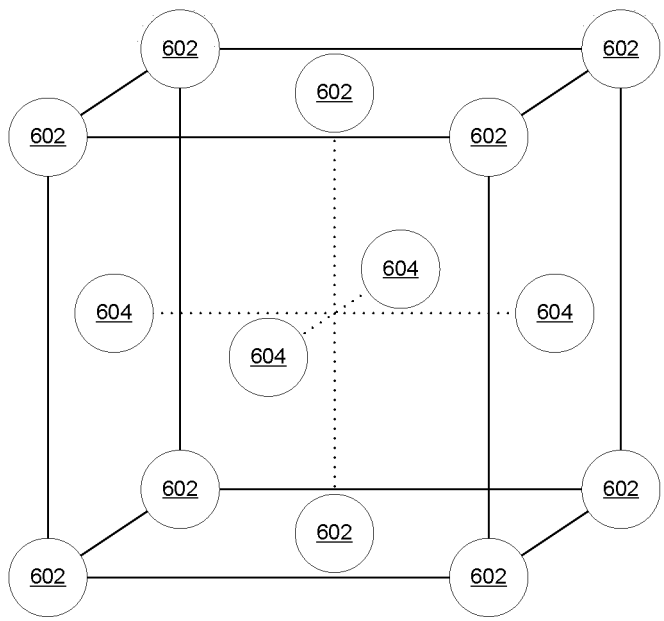
FIG. 6 is a crystal unit cell of a $L1_0$ phase constitution platinum-iron binary alloy.

For example, as shown in the iron-platinum (FePt) binary phase diagram of FIG. 5, the $L1_0$ phase constitution can be a solid solution including between about 35 atomic percent (at. %) and about 57 at. % platinum (Pt), with the remainder Fe and incidental impurities (e.g., less than about 1 at. % impurities). More preferably, FIG. 6 shows an $L1_0$ phase constitution in which Pt atoms 602 and Fe atoms 604 are ordered in alternating sheets in an 1:1 atomic ratio (for an alloy that is approximately 50 at. % Pt and approximately 50 at. % Fe, not including incidental impurities).

The $L1_0$ phase typically requires a relatively high temperature (greater than about 500° C.) annealing of a FCC disordered alloy (also referred to as an A1 phase alloy) to produce the ordered structure of Pt and iron (Fe) atoms in the $L1_0$ phase constitution. This high temperature annealing step has prevented the use of FePt alloys in hard disc read heads, such as read head 200, because the remaining components of the read head 200 (e.g., sensor 218) degrade at such temperatures.

In one aspect, the present disclosure is directed to a method of forming alloys having an ordered phase constitution without requiring a high temperature annealing step. The method generally includes the use of a multilayer structure including a seed layer and a cap layer. The multilayer structure further includes at least one intermediate layer that includes the alloy. In some embodiments, the seed and/or cap layers include a component of the alloy, and in some preferred embodiments, the seed and/or cap layer component is a minority component of the alloy.

Figure 7:
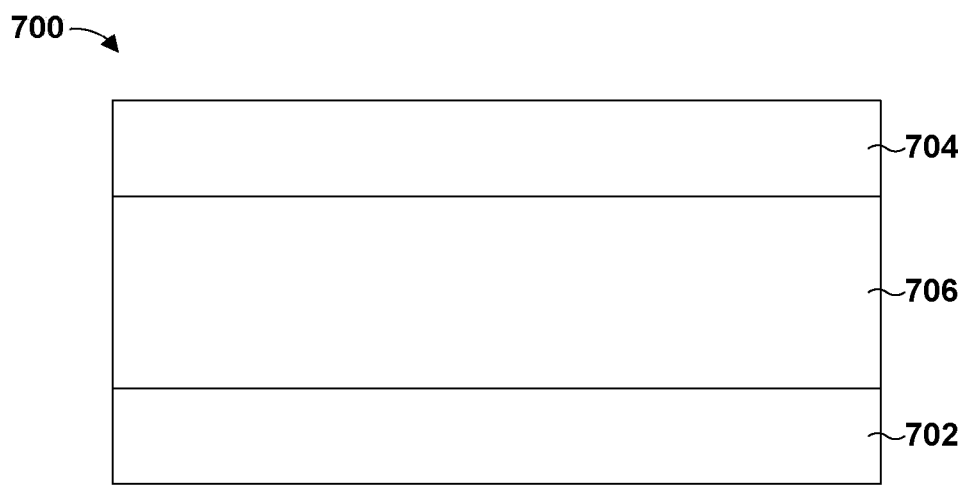
FIG. 7 is a block diagram of a multilayer structure including a seed layer, a cap layer and an intermediate alloy layer.

FIG. 7 illustrates a multilayer structure 700 that may be used to produce an ordered phase constitution alloy with high anisotropy. Multilayer structure 700 includes a seed layer 702, a cap layer 704 and an intermediate alloy layer 706 formed between seed layer 702 and cap layer 704. Alloy layer 706, seed layer 702 and cap layer 704 may be made from a wide range of components including, for example, Pt, Fe, Mn, Ir, Co, or the like for producing a ferromagnetic alloy, a ferrimagnetic alloy, or an antiferromagnetic alloy. In some embodiments, seed layer 702 and cap layer 704 include a component that is present in alloy layer 706. In other embodiments, seed layer 702 and cap layer 704 include a component that is not present in alloy layer 706.

In some embodiments, at least one of seed layer 702 and cap layer 704 include more than one component that is present in alloy layer 706. For example, seed layer 702, cap layer 704 and alloy layer 706 may each include a first component and a second component. In some embodiments, at least one of seed layer 702 and cap layer 704 include a majority amount of the component that is present in alloy layer 706 in a minority amount. For example, at least one of seed layer 702 and cap layer 704 may include a majority of Pt and a minority of Fe, which alloy layer 706 includes a majority of Fe and a minority of Pt. In some embodiments, both seed layer 702 and cap layer 704 include a majority of the component that is present in alloy layer 706 in a minority amount.

Seed layer 702, alloy layer 706 and cap layer 704 may be deposited using a number of techniques, including, for example, sputtering, ion beam deposition, chemical vapor deposition, physical vapor deposition, molecular beam epitaxy, laser ablation, and the like. In one embodiment, seed layer 702 is deposited on a substrate using one of these techniques, alloy layer 706 is deposited on seed layer 702 using the same or a different technique and cap layer 704 is deposited on alloy layer 706 using any of the techniques.

Utilizing a seed layer 702 and a cap layer 704 may be advantageous compared to annealing a single film of the alloy, annealing an alloy with only a seed layer 702 or annealing an alloy with only a cap layer 704. FIGS. 8A-D illustrate one such advantage. One important parameter shown in these plots is the coercivity of the alloy. The coercivity is the magnetic field at which the magnetic moment is equal to zero, or the point at which the magnetic moment-magnetic field curve crosses the magnetic field axis (the x-axis). The in-plane coercivity indicates the extent to which the atoms are ordered into an ordered phase constitution and the extent of magnetic anisotropy in the alloy. That is, a higher in-plane coercivity indicates a more highly ordered alloy with greater magnetic anisotropy.

Figure 8A:
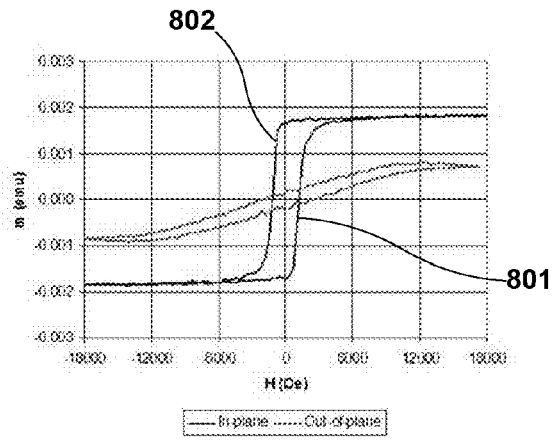
FIGS. 8A-D are plots of magnetic moment versus magnetic field for an iron-platinum magnetic material formed as a single film layer, formed with a platinum seed layer, formed with a platinum cap layer, and formed with both a platinum seed layer and a platinum cap layer, respectively.
Figure 8B:
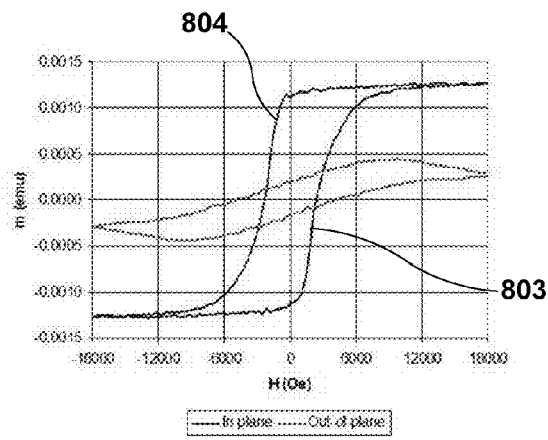

For example, FIG. 8A shows the magnetic moment of a FePt alloy in response to an applied magnetic field. The FePt alloy of FIG. 8A included, prior to annealing, about 38 at. % Pt and about 62 at. % Fe and was annealed at a temperature of about 300° C. for about 4 hours. As can be seen, the in-plane coercivity, calculated by averaging the absolute values of the coercivities of curves 801 and 802, is approximately 1420 Oe. FIG. 8B, then, shows a FePt alloy of the same composition as the alloy of FIG. 8A that was formed with a Pt seed layer 702. The sample in FIG. 8B was annealed at a temperature of about 300° C. for about 4 hours, similar to the sample in FIG. 8A. The sample of FIG. 8B shows an in-plane coercivity, calculated by averaging the absolute values of the coercivities of curves 803 and 804, of approximately 2400 Oe.

Figure 8C:
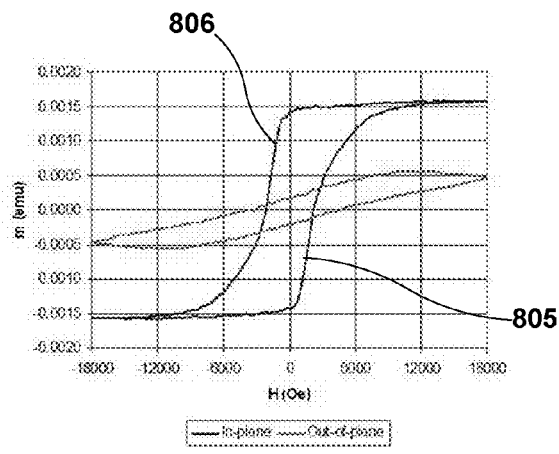

FIG. 8C shows the results from a FePt alloy sample again including, prior to annealing, about 38 at. % Pt and about 62 at. % Fe. The sample was annealed at a temperature of about 300° C. for about 4 hours with a cap layer 704 of Pt. The sample shows an in-plane coercivity, calculated by averaging the absolute values of the coercivities of curves 805 and 806, of about 2200 Oe, similar to the alloy of FIG. 8B.

Figure 8D:
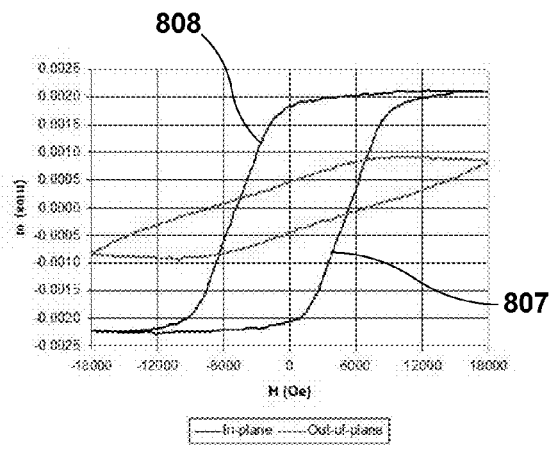

FIG. 8D, then, shows the results from a FePt alloy sample including, prior to annealing, about 38 at. % Pt and 62 at. % Fe that was formed with a Pt seed layer 702 and a Pt cap layer 704 and annealed at a temperature of about 300° C. for about 4 hours. The sample shows an in-plane coercivity, calculated by averaging the absolute values of the coercivities of curves 807 and 808, of about 5100 Oe, which is significantly higher than any of the samples shown in FIGS. 8A-C. While not wishing to be bound by any theory, presently available data indicates that this effect is due to interdiffusion occurring at both the seed layer 702/alloy layer 706 and cap layer 704/alloy layer 706 interfaces, which facilitates ordering of the Fe and Pt atoms into an $L1_0$ phase constitution.

In some embodiments, seed layer 702 and cap layer 704 may comprise components that are not present in intermediate alloy layer 706. For example, in one embodiment, seed layer 702 and/or cap layer 704 comprise silver, while alloy layer 706 comprises a FePt alloy.

Figure 9A:
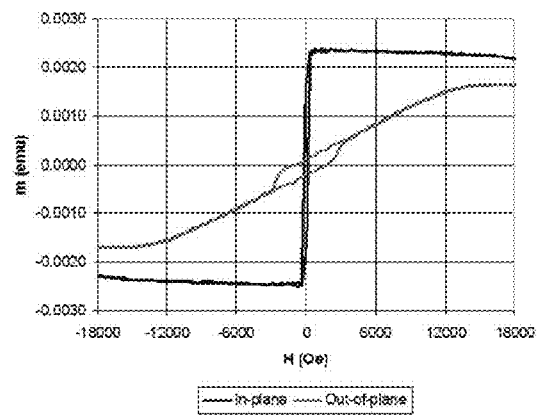
FIGS. 9A-9C are plots of magnetic moment versus magnetic field for iron-platinum alloys formed with seed and cap layers comprising one of silver or platinum.
Figure 9B:
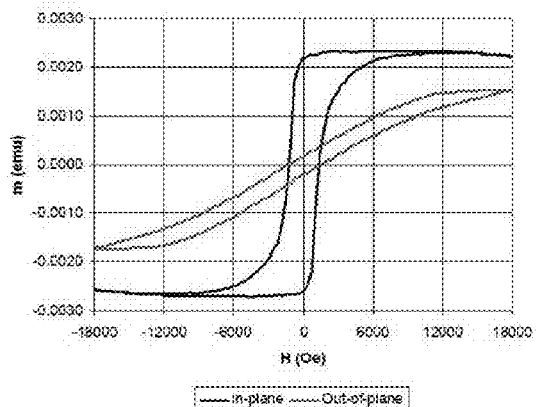
Figure 9C:
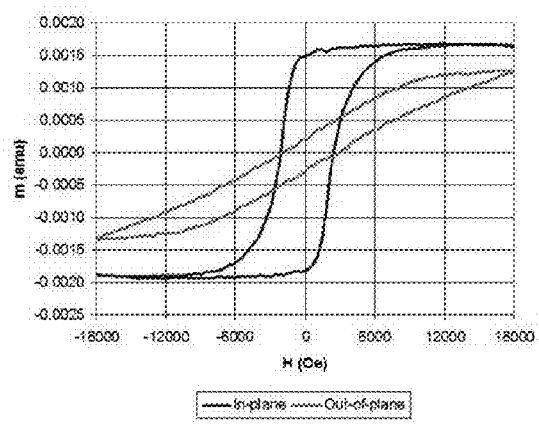

FIGS. 9A-C show magnetic moment versus magnetic field plots for three FePt alloys formed with different seed layer 702 and cap layer 704 compositions. As FIG. 9A shows, annealing a FePt alloy including, prior to annealing, about 38 at. % Pt and about 62 at. % Fe with a silver seed layer 702 and silver cap layer 704 for about 4 hours at about 300° C. produces a FePt alloy with a relatively low in-plane coercivity, approximately 200 Oe. FIG. 9B shows the response of a FePt alloy of the same composition as FIG. 9A formed with a silver seed layer 702 and a platinum cap layer 704 after annealing at the same conditions. The in-plane coercivity is much higher, about 1300 Oe. FIG. 9C, then, shows the response of a FePt alloy of the same composition as FIG. 9A formed with a platinum seed layer 702 and a silver cap layer 704 after annealing at the same conditions. The in-plane coercivity of this sample is about 2300 Oe. These coercivities are much lower than the coercivity of sample shown in FIG. 8D, which was formed with a Pt seed layer 702 and a Pt cap layer 704.

Seed layer 702 and cap layer 704 may also comprise either a component which is present in a minority amount (i.e., less than 50 at. %) in the intermediate alloy layer 706, or a component that is present in alloy layer 706 in a majority amount (i.e., greater than 50 at. %). It may be advantageous in some embodiments to utilize a seed layer 702 and a cap layer 704 that comprise a component which is present in alloy layer 706 in a minority amount. For example, to produce a $L1_0$ FePt alloy including a majority of Fe, a Pt seed layer 702 and a Pt cap layer 704 may be used. As another example, to produce a $L1_0$ FePt alloy including a majority of Pt, a Fe seed layer 702 and a Fe cap layer 704 may be used.

The use of a seed layer 702 and cap layer 704 comprising a component that is present in intermediate alloy layer 706 in a minority amount results in the component in seed and cap layers 702, 704 to diffuse into alloy layer 706, while the other component(s) (those present in alloy layer 706 in a majority amount) diffuse from alloy layer 706 to seed layer 702 and cap layer 704. This two-component diffusion results in an alloy with a composition that is closer to a 50:50 ratio that the starting alloy. The two-component diffusion also facilitates the reordering of atoms that is necessary to produce the phase transformation to an $L1_0$ phase.

Figure 10A:
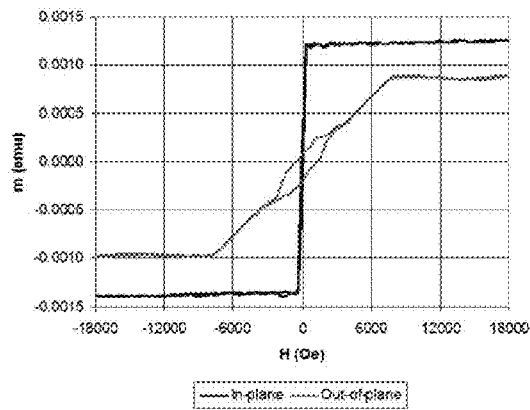
FIGS. 10A-10D are plots of magnetic moment versus magnetic field for iron-platinum alloys formed with seed and cap layers comprising one of iron or platinum.
Figure 10B:
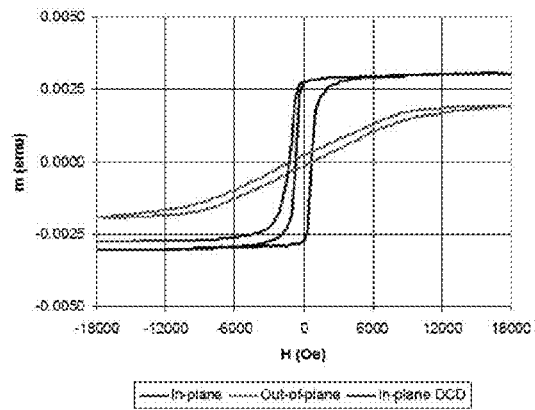
Figure 10C:
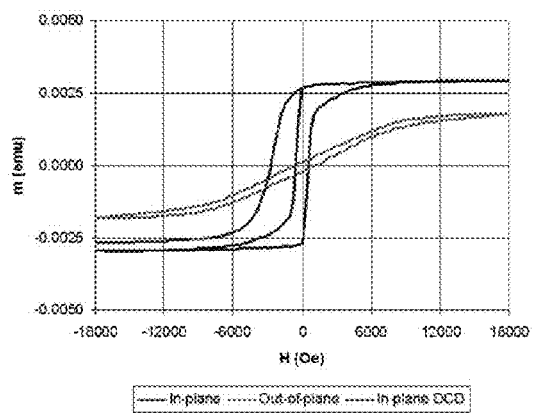

FIGS. 10A-D illustrate a series of samples including, prior to annealing, about 36 at. % Fe and about 64 at. % Pt after annealing the samples at a temperature of about 300° C. for about 4 hours. FIG. 10A shows a plot of the magnetic moment versus magnetic field for a sample formed with a Pt seed layer 702 and Pt cap layer 704. The sample shows low in-plane coercivity, indicating poor ordering of the atoms and low anisotropy. FIG. 10B illustrates the response of a similar alloy formed with a Pt seed layer 702 and a Fe cap layer 704. The in-plane coercivity is larger, about 700 Oe, which indicates better ordering of the Fe and Pt atoms into an $L1_0$ phase constitution than for the sample formed with a Pt seed layer 702 and cap layer 704. FIG. 10C is a plot of the response of another similar alloy formed with a Fe seed layer 702 and a Pt cap layer 704. The in-plane coercivity is about 600 Oe, similar to that of the sample shown in FIG. 10B.

Figure 10D:
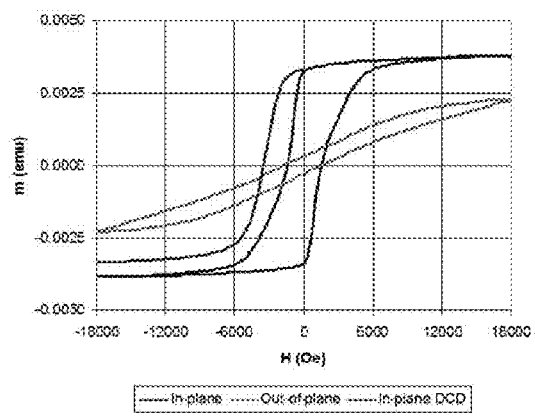

FIG. 10D illustrates the response of an alloy formed with a Fe seed layer 702 and a Fe cap layer 704. The in-plane coercivity is substantially higher, about 1500 Oe, indicating yet better ordering of the Fe and Pt atoms of the alloy layer 706 into a $L1_0$ phase constitution and higher anisotropy.

The results shown in FIGS. 9A-C and 10A-D show that the composition of seed layer 702 and cap layer 704 plays an important role in the formation of an ordered phase constitution in alloy layer 706, which is indicated by the coercivity of the alloy. For example, FIGS. 9A-C imply that the annealing process more effectively produces an ordered phase constitution having high anisotropy in alloy layer 706 when seed layer 702 and cap layer 704 comprise a component of alloy layer 706. FIGS. 10A-D, then, indicate that the annealing process is even more effective at producing an ordered phase constitution having high anisotropy when seed layer 702 and cap layer 704 include the component which is present in the alloy layer 706 in a minority amount.

The use of a seed layer 702 and a cap layer 704 is intended to facilitate the formation of an ordered phase constitution having high anisotropy. While not wishing to be bound by any theory, seed layer 702 and cap layer 704 may enhance interdiffusion of the alloy components and the component(s) of seed layer 702 and cap layer 704 at the interface of seed layer 702 and intermediate alloy layer 706 and at the interface of cap layer 704 and alloy layer 706. This improved interdiffusion of the components at the interfaces may improve the ordering of the entire alloy layer 706, and also may drive the composition of alloy layer 706 towards a more stoichiometric ratio of components. This results in an alloy that includes an ordered phase constitution having high anisotropy, such as an $L1_0$ phase constitution, a $L1_2$ phase constitution, or the like.

Because of the enhanced interdiffusion provided by the use of seed layer 702 and cap layer 704, high coercivity alloys may be formed at a much lower annealing temperature. For example, a FePt $L1_0$ alloy may be produced by annealing a multilayer structure 700 at a temperature in the range from about 250° C. to about 400° C. for up to about 6 hours. Preferably, multilayer structure 700 may be annealed at a temperature of about 250° C. to about 350° C., more preferably about 300° C. In some embodiments, the annealing may preferably be for about 4 hours.

Annealing at a lower temperature may limit grain growth in the alloy compared to annealing at a higher temperature. This may be particularly desirable, for example, for a magnetic material that is to be used in a magnetic storage medium, where the data density is related to the grain size of the magnetic material.

Figure 11A:
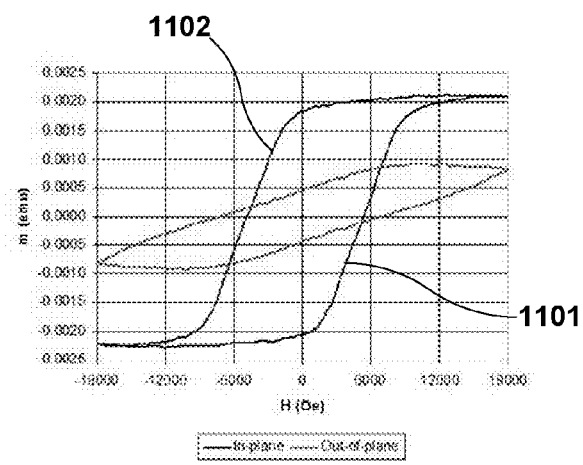
FIGS. 11A-11C are plots of magnetic moment versus magnetic field for iron-platinum alloys of various compositions formed with platinum seed and cap layers.
Figure 11B:
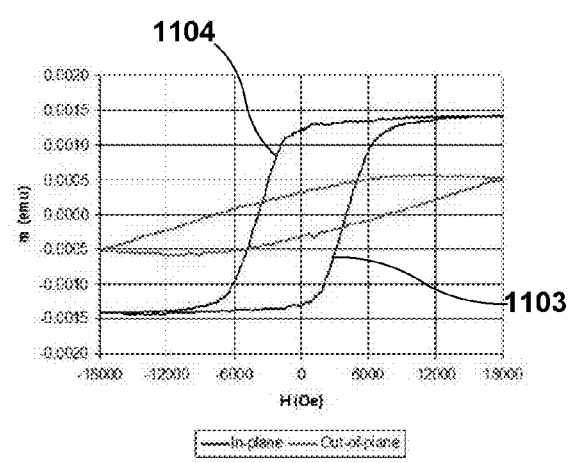
Figure 11C:
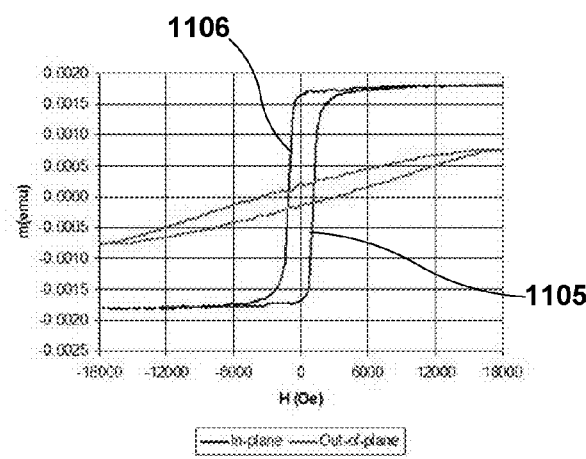

The amount of ordering and anisotropy, and thus the coercivity of an alloy, produced by the low-temperature annealing also depends on the relative amounts of Fe and Pt in alloy layer 706. FIGS. 11A-C show plots of magnetic moment versus magnetic field for three alloy compositions after annealing with a Pt seed layer 702 and cap layer 704 for about 4 hours at about 300° C. For example, FIG. 11A shows the response of an alloy including, prior to annealing, about 62 at. % Fe and about 38 at. % Pt. The in-plane coercivity, calculated by averaging the absolute values of the coercivities of curves 1101 and 1102, was found to be about 5100 Oe, as in FIG. 8D. FIG. 11B shows the response of an alloy including, prior to annealing, about 70 at. % Fe and about 30 at. % Pt. The in-plane coercivity, calculated by averaging the absolute values of the coercivities of curves 1103 and 1104, was found to be about 4000 Oe. Finally, FIG. 11C shows the response of an alloy including, prior to annealing, about 77 at. % Fe and about 23 at. % Pt. The in-plane coercivity, calculated by averaging the absolute values of the coercivities of curves 1105 and 1106, was found to be about 1200 Oe. These results indicate that the coercivity of a FePt alloy decreases as the Fe content increases. While not wishing to be bound by any theory, it is believed that the decreased coercivity is due to decreased ordering of the FePt alloy into an $L1_0$ phase constitution.

Figure 12A:
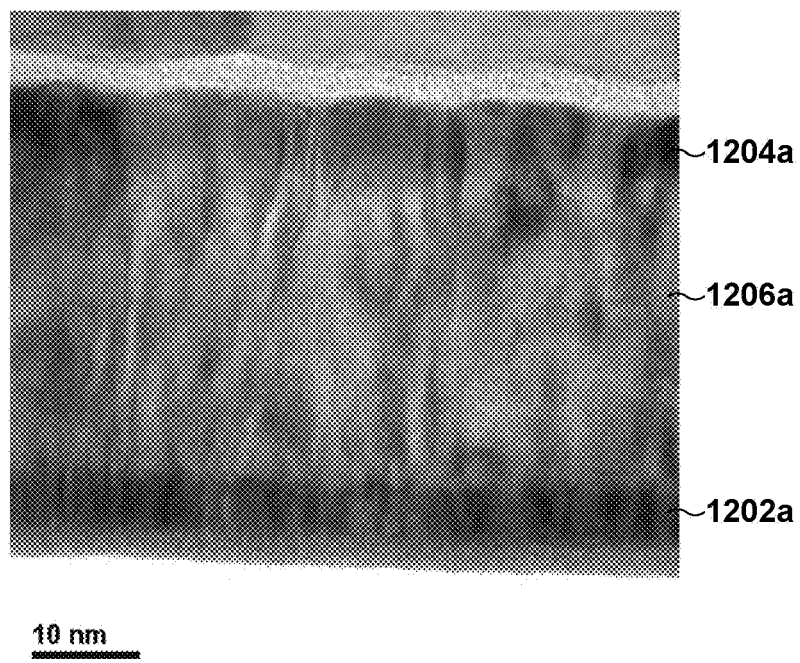
FIGS. 12A and 12B are transmission electron microscopy (TEM) micrographs of an iron-platinum magnetic material with a platinum seed layer and a platinum cap layer before and after annealing, respectively.
Figure 12B:
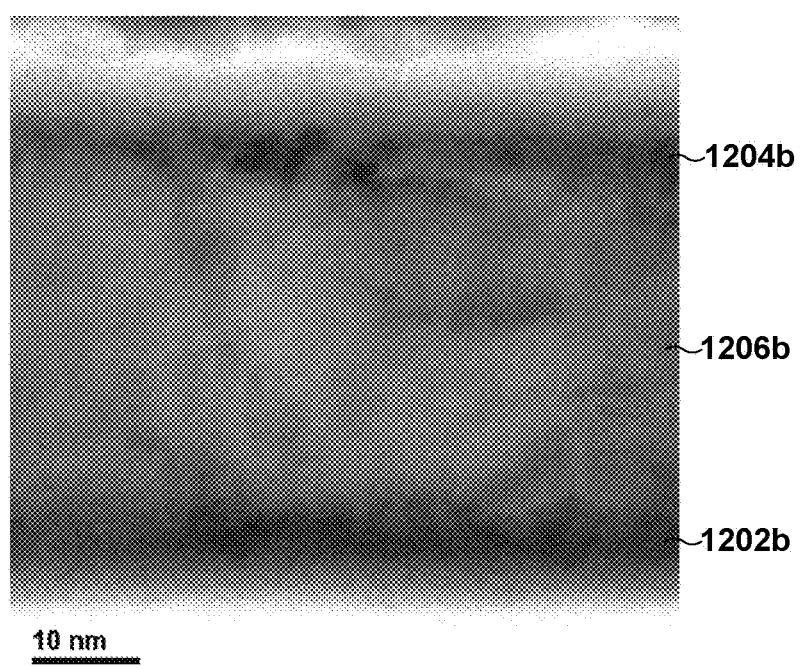

FIGS. 12A and 12B show transmission electron microscopy (TEM) micrographs of a Pt—FePt—Pt multilayer structure before and after annealing, respectively. The darker bands at the bottom and top of the FIG. 12A are a Pt seed layer 1202a and cap layer 1204a, respectively, while the lighter intermediate layer 1206a is the FePt alloy. After annealing at about 300° C. for about 4 hours, the transition from the Pt layers 1202b, 1204b to the intermediate layer 1206b becomes less distinct, and the layer 1206b itself is a more uniform shade, implying the formation of a more uniform phase structure.

Figure 13A:
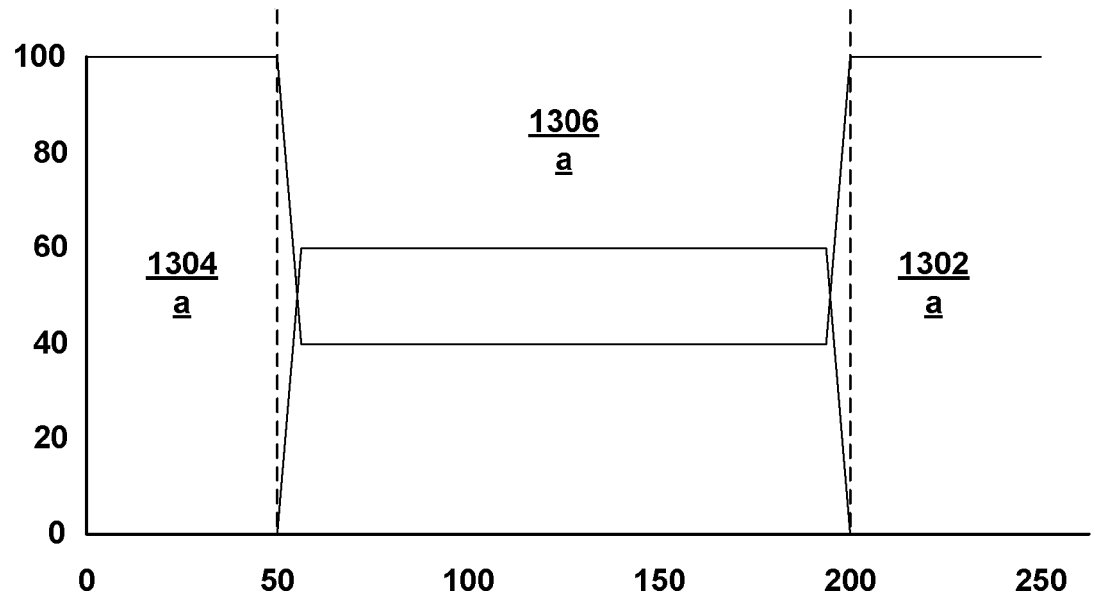
FIGS. 13A and 13B are plots of concentration versus depth for an iron-platinum magnetic material with a platinum seed layer and a platinum cap layer before and after annealing, respectively.
Figure 13B:
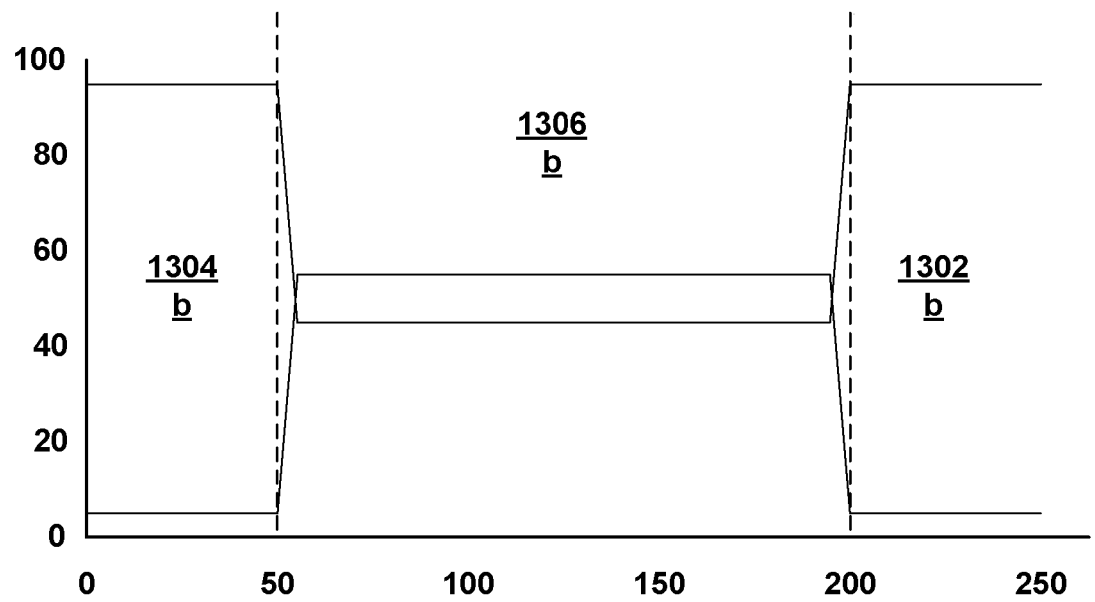

FIGS. 13A and 13B show example plots of composition versus depth for a sample similar to that shown in FIGS. 12A and 12B. FIG. 13A shows pure Pt layers 1302a, 1304a at the surface and at a depth of about 200-250 Å. Intermediate region 1306a, from about 50 Å to about 200 Å includes an alloy comprising about 60 at. % Fe and about 40 at. % Pt. After annealing at a temperature of about 300° C. for about 4 hours, the sample was remeasured and plot shown in FIG. 13B was produced. As can be seen, Pt diffused from both of the pure Pt layers into the FePt alloy. Accordingly, the Pt content of layers 1302b and 1304b has dropped to about 95 at. %, and the Pt content of the FePt alloy intermediate region 1306b has raised to about 45 at. %. Further, while not shown, the phase constitution has changed from FCC to $L1_0$.

Figure 14:
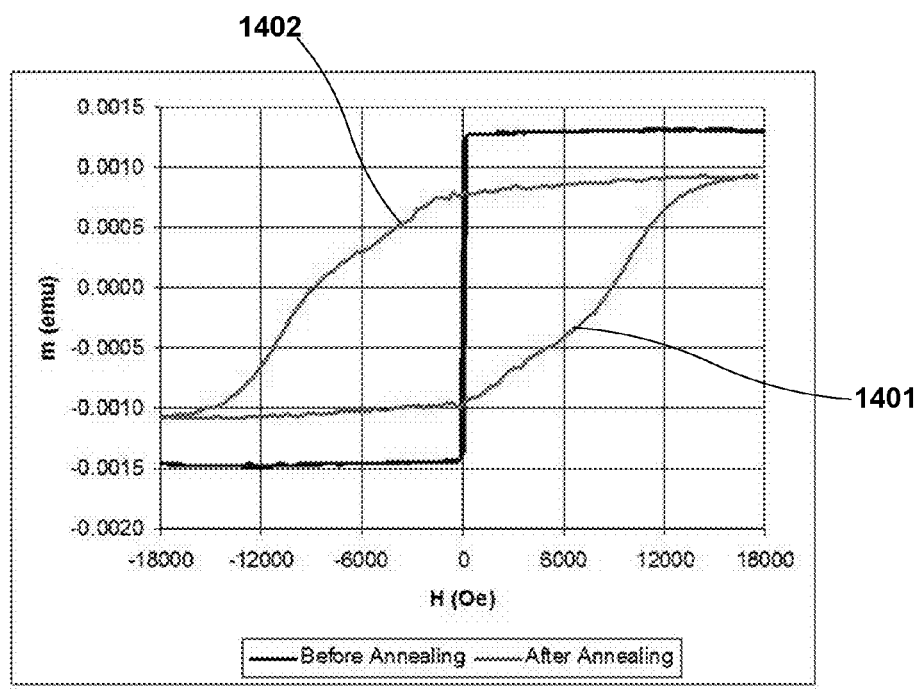
FIG. 14 is a plot of magnetic moment versus magnetic field for an iron-platinum magnetic material formed with a platinum seed layer and a platinum cap layer.

FIG. 14 shows a plot of the magnetic response of a FePt binary alloy including about 64 at. % Fe and about 36 at. % Pt. The sample has been annealed at a temperature of about 300° C. for about 4 hours prior to the measurement of the magnetic response, and has been formed with a Pt seed layer and a Pt cap layer. The alloy shows an in-plane coercivity of about 9130 Oe.

FePt alloys with a $L1_0$ phase constitution formed by the above method may make desirable biasing magnets for hard disc read heads. The $L1_0$ FePt alloys have a suitably high coercivity and magnetic moment to bias the free layer in the desired magnetic orientation. Further, the relative amounts of Fe and Pt in the alloy may be designed to provide the desired properties to the biasing magnet. For example, forming an alloy with a higher Fe content leads to a higher saturation magnetization, but a lower coercivity. Conversely, forming an alloy with a higher Pt content leads to a lower saturation magnetization, but a higher coercivity.

The biasing magnets may comprise, prior to annealing, from about 80 at. % Fe and about 20 at. % Pt to about 30 at. % Fe and about 70 at. % Pt, preferably from about 65 at. % Fe and about 35 at. % Pt to about 40 at. % Fe and about 60 at. % Pt.

The FePt biasing magnets may comprise a thickness that is at least partially dependent on the geometry of the hard disc read head. For example, the shield-to-shield distance of current hard disc read heads may range from about 150 Å to about 700 Å. Accordingly, the thickness of the multilayer structure 700 may be up to about 700 Å thick. In some preferred embodiments, the seed and cap layers 702, 704 each include a thickness of up to about 200 Å, more preferably ranging from about 25 Å to about 125 Å. The intermediate alloy layer 706 may include a thickness of up to about 400 Å, preferably about 100 Å to about 300 Å.

The biasing magnets may be deposited into the read head (e.g., read head 200) as one step in the manufacture of the read head, and the entire read head subsequently exposed to the low temperature annealing necessary to form the $L1_0$ phase constitution. The temperature of the annealing is sufficiently low to not affect the performance of the remaining portions of the read head (e.g., sensor 218).

The $L1_0$ phase constitution FePt alloys of the current disclosure may also include multiple layers of different compositions. For example, the alloy may include a Pt-rich layer and a Fe-rich layer. Including multiple layers of different compositions may allow further tailoring of the magnetic field produced by the biasing magnet, and thus the bias imparted to the free layer, and other layers, of the sensor.

Figure 15:
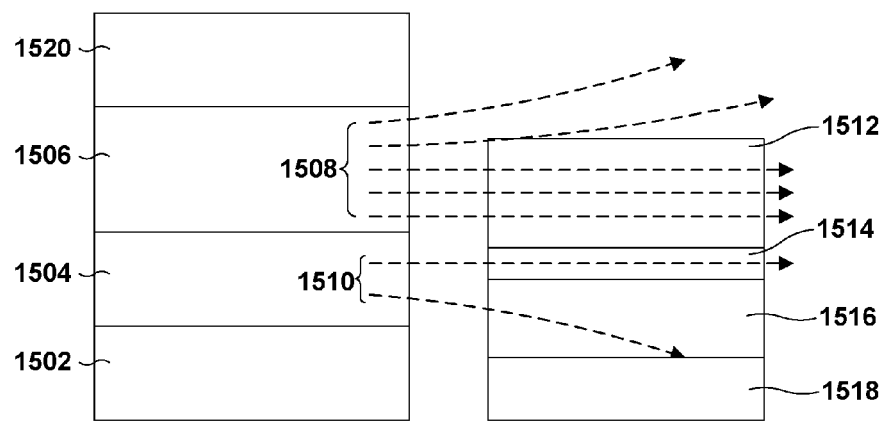
FIG. 15 is a block diagram of a multilayer iron-platinum alloy including two layers with different compositions.

For example, in many embodiments, it may be desirable to have a relatively high bias on the free layer, with a minimal bias on the reference and pinned layers. In order to accomplish this, the biasing magnet may include a Fe-rich layer 1506 approximately adjacent the free layer 1512, and a less Fe-rich layer 1504 approximately adjacent the tunneling barrier layer 1514, the reference layer 1516, and/or pinned layer 1518, as shown in FIG. 15. The Fe-rich layer 1506 produces a sufficiently large magnetic field, represented by flux lines 1508, to bias the free layer 1512, while the less Fe-rich layer 1504 possesses high coercivity, but produces a relatively weaker magnetic field, represented by flux lines 1510, and thus does not affect the reference 1516 and pinned layers 1518 as strongly. The biasing magnet 1500 further includes a Pt seed layer 1502 and a Pt cap layer 1520, which, as described above, enables the formation of an $L1_0$ phase constitution in the less Fe-rich layer 1504 and the Fe-rich layer 1506.

Further, the method of producing ordered phase constitution alloys may be extended to alloys of other materials. For example, the method of using a seed layer and a cap layer may be used to produce $L1_0$ phase CoPt alloys for use in applications that require a high anisotropy magnetic material. Additionally, the method may be used to produce L1$_2$ phase constitution IrMn$_3$ or PtMn$_3$ materials for use as an antiferromagnetic material.

As described above, in some embodiments a biasing magnet may include a plurality of layers (a multilayer stack) between the seed layer and the cap layer. The multilayer stack may provide one or more properties to the biasing magnet. For example, in some embodiments, a biasing magnet including seed and cap layers and a multilayer stack between the seed layer and cap layer may be annealed at a reduced temperature to induce the phase transition to an ordered phase, e.g., an L1$_0$ phase. In such embodiments, the compositions of the individual layers may be different, and the difference in composition between adjacent layers may result in diffusion of one or more components of one layer into an adjacent layer, and vice versa. Such diffusion may facilitate formation of the ordered phase, and may reduce the annealing temperature that may be used to produce the ordered phase compared to a biasing magnet that includes a single intermediate alloy layer. For example, in some embodiments, a biasing magnet formed from a seed layer, cap layer, and a multilayer stack between the seed layer and cap layer may be annealed to form an ordered phase at a temperature of about 200° C. to about 500° C. In other embodiments, the biasing magnet may be annealed to form the ordered phase at a temperature of about 200° C. to about 300° C., or at a temperature of about 280° C. In some examples, the layers may comprise alternating compositions, e.g., alternating Pt-rich and Fe-rich layers.

In other examples, the layers of the multilayer stack may have compositions that result in a biasing magnet that has a compositional gradient; that is, a composition that changes along one or more direction within the biasing magnet. A biasing magnet including seed and cap layers and a multilayer stack between the seed layer and cap layer may provide a magnetic moment and/or coercivity that changes in at least one direction of the biasing magnet. The magnetic moment and/or coercivity may depend on the composition of the biasing magnet. In this way, a biasing magnet having a composition that changes along one or more direction may result in a biasing magnet having a magnetic moment and/or coercivity that changes along the one or more direction. For example, a biasing magnet that has a compositional gradient, e.g., from Pt-rich to Fe-rich, may have a magnetic moment gradient, a coercivity gradient, or both.

FIG. 16A illustrates an example biasing magnet 1600 that may include a seed layer 1602, a cap layer 1612, and a multilayer stack 1604 between seed layer 1602 and cap layer 1612. In the embodiment illustrated in FIGS. 16A and 16B, multilayer stack 1604 comprises a first layer 1606, a second layer 1608, and a third layer 1610. In other embodiments, multilayer stack 1604 may include more or fewer layers.

In general, seed layer 1602 and cap layer 1612 may include at least one component described above. For example, seed layer 1602 and/or cap layer 1612 may include at least one of a Pt-group metal, Fe, Mn, Co, or the like. The Pt-group metal may include at least one of Pt, Pd, Ir, Rh and Ru. In some embodiments, at least one of seed layer 1602 and cap layer 1612 may include an alloy of at least two of Fe, Mn, Co, a Pt-group metal, or the like. Seed layer 1602 and cap layer 1612 may include the same component, or seed layer 1602 and cap layer 1612 may comprise different components.

Similarly, first layer 1606, second layer 1608, and third layer 1610 each may comprise at least one of a Pt-group metal, Fe, Mn, Co, or the like. In some embodiments, at least one of first layer 1606, second layer 1608, and third layer 1610 may comprise an alloy of at least two components. Each of first layer 1606, second layer 1608, and third layer 1610 may comprise the same component, an alloy of the same components, different components, or an alloy of different components. In some embodiments, first layer 1606, second layer 1608, and third layer 1610 comprise similar components, and at least one of first layer 1606, second layer 1608, and third layer 1610 comprises a different composition (e.g., a different proportion of the same components) than at least one other of first layer 1606, second layer 1608, and third layer 1610.

FIG. 16B is a plot of a composition of one example of biasing magnet 1600, and extends from a composition of 100 at. % Pt to a composition of 100 at. % Fe. FIG. 16B illustrates an example composition of biasing magnet 1600 prior to annealing (lines 1614, 1616, 1618, 1620, and 1622) and after annealing (line 1624). As illustrated in FIG. 16B, seed layer 1602 and cap layer 1612 each may include approximately 100 at. % Pt, as represented by lines 1614 and 1622, respectively. While not shown in FIG. 16B, seed layer 1602 and/or cap layer 1612 may comprise other components in addition to or instead of Pt. Additionally, seed layer 1602 may comprise a different composition than cap layer 1612 in some embodiments.

Returning to FIG. 16B, first layer 1606 and third layer 1610 may comprise more Fe than seed layer 1602 and cap layer 1612, as represented by line 1616 and line 1620, respectively. In other embodiments, first layer 1606 and third layer 1610 may include a more Fe-rich alloy or less Fe-rich alloy than the alloys represented by line 1616 and line 1620. Second layer 1608, then, may comprise the greatest amount of Fe, as shown by line 1618. While according to FIG. 16B second layer 1608 includes an alloy of Pt and Fe, in other embodiments, second layer 1608 may include only Fe, or may include a more Fe-rich alloy or less Fe-rich alloy than the alloy represented in FIG. 16B. As FIGS. 16A and 16B illustrate, biasing magnet 1600 has a compositional profile both before and after annealing that is substantially symmetric about a plane 1624 approximately equidistant from and substantially parallel to seed layer 1602 and cap layer 1612.

As illustrated by line 1624, annealing of biasing magnet 1600 may result in a composition profile that is blurred or smoothed compared to the composition profile before annealing. As line 1624 shows, components of the individual layers 1602, 1606, 1608, 1610, and 1612 may diffuse between adjacent layers of biasing magnet 1600 during annealing. For example, a portion of the Fe in first layer 1606 may diffuse into seed layer 1602, and Pt from seed layer 1602 may diffuse into first layer 1606. Similar diffusion also may occur between other adjacent layers, e.g., between first layer 1606 and second layer 1608, between second layer 1608 and third layer 1610, and between third layer 1610 and cap layer 1612. Diffusion of components between adjacent layers of biasing magnets 1600 may result in a smoother or blurred composition gradient, and may facilitate ordering of the atoms of the layers into an ordered crystal structure, such as an L1$_0$ phase structure. Although FIG. 16B shows a composition profile after annealing (line 1624) that includes rounded steps and is not completely smooth, in other embodiments, the composition profile may be smoother or less smooth. The particular composition profile after annealing may be a function of a number of parameters, including, for example, annealing time, annealing temperature, thickness of layers 1602, 1606, 1608, 1610, and 1612, the composition of layers 1602, 1606, 1608, 1610, and 1612, and the like. In any case, other composition profiles, both smoother and less smooth, are contemplated by this disclosure.

As described above, a biasing magnet 1600 comprising a higher percentage of Fe may have a higher magnetic moment and lower coercivity than a biasing magnet comprising a lower percentage of Fe. Similarly, a layer comprising a higher percentage of Fe may have a higher magnetic moment and lower coercivity than a layer comprising a lower percentage of Fe. In this way, second layer 1618 may have a higher magnetic moment and lower coercivity than first layer 1606, third layer 1610, seed layer 1602, and cap layer 1612. In some embodiments, second layer 1608 may be approximately aligned with a free layer of a read sensor, e.g., free layer 226 (FIG. 2), and seed layer 1602, first layer 1606, third layer 1610, and cap layer 1612 may be adjacent to other layers of the sensor, e.g., other layers of sensor 218 (FIG. 2). In embodiments such as these, the strength of the magnetic field that influences the layers of sensor 218 other than free layer 226 may be reduced, which may improve read performance of sensor 218. For example, the described alignment of biasing magnet 1600 and sensor 218 may improve the signal-to-noise ratio of the sensor.

Seed layer 1602 and cap layer 1612 each may have a thickness of up to about 200 Å, more preferably ranging from about 25 Å to about 125 Å. Multilayer stack 1604 may include a total thickness of up to about 400 Å, and in some embodiments, about 100 Å to about 300 Å. First layer 1606, second layer 1608, and third layer 1610 may have similar thicknesses or different thicknesses. Each of first layer 1606, second layer 1608, and third layer 1610 may have a thickness of up to about 50 Å, and in some embodiments, may have a thickness of about 5 Å to about 30 Å, or about 10 Å to about 15 Å.

Seed layer 1602, first layer 1606, second layer 1608, third layer 1612, and cap layer 1616 may be formed using, for example, sputtering, ion beam deposition, chemical vapor deposition, physical vapor deposition, molecular beam epitaxy, laser ablation, and the like. Each of the layers may be formed using the same technique, or at least one of the layers may be formed by a different technique than at least one other of the layers.

While FIG. 16A illustrates a biasing magnet 1600 including a multilayer stack 1604 comprising three layers 1606, 1608, and 1610, in other embodiments, a multilayer stack may include two layers or more than three layers. For example, as illustrated in FIG. 17A, a biasing magnet 1700 may include a multilayer stack 1704 comprising five layers 1706, 1708, 1710, 1712, and 1714. Similar to biasing magnet 1600, the layers of biasing magnet 1700 may produce a compositional gradient both prior to and after annealing of biasing magnet 1700 that may be substantially symmetric about a plane 1734 approximately equidistant from and substantially parallel to seed layer 1702 and cap layer 1716, as shown in FIG. 17B.

As shown in FIGS. 17A and 17B, each of the five layers 1706, 1708, 1710, 1712, and 1714 may be approximately the same thickness. For example, as described above with respect to FIGS. 16A and 16B, each of the five layers 1706, 1708, 1710, 1712, and 1714 may have a thickness of up to about 50 Å. In other examples, each of the five layers 1706, 1708, 1710, 1712, and 1714 may have a thickness of about 5 Å to about 30 Å, or about 10 Å to about 15 Å. In some embodiments, at least one of the five layers 1706, 1708, 1710, 1712, and 1714 may have a thickness different than a thickness of at least one other of the five layers 1706, 1708, 1710, 1712, and 1714.

In the embodiment illustrated in FIGS. 17A and 17B, seed layer 1702 and cap layer 1716 include approximately 100 at % Pt. In other embodiments, at least one of seed layer 1702 and cap layer 1716 may be formed of another Pt-group element, such as, for example, Pd, Ir, Rh, or Ru, may be formed of an alloy of two or more Pt-group elements, or may comprise at least one element in addition to or as an alternative to a Pt-group element. For example, at least one of seed layer 1702 and cap layer 1716 may comprise at least one of Mn, Co, Fe, or the like, in addition to or instead of a Pt-group element.

FIG. 17B shows first layer 1706 and fifth layer 1714 as including an alloy of Pt and Fe and, more particularly, an alloy of Pt and Fe that includes a majority of Pt, e.g., a Pt-rich alloy. In other embodiments, at least one of first layer 1706 and fifth layer 1714 may include a greater atomic percent Fe or a lesser atomic percent Fe, may include one or more additional elements, or may include an alloy of different elements, e.g., an alloy of at least two of a Pt-group element, Fe, Mn, Co, or the like. Additionally, while FIG. 17B illustrates first layer 1706 and fifth layer 1714 as including approximately the same composition, in other embodiments, first layer 1706 and fifth layer 1714 may include different compositions. In other embodiments, at least one of first layer 1706 and fifth layer 1714 may include an alloy that includes a majority of Fe, i.e., a Fe-rich alloy.

FIG. 17B also illustrates second layer 1708 and fourth layer 1712 as including an alloy of Pt and Fe and, more particularly, an alloy of Pt and Fe that includes a majority of Fe, i.e., a Fe-rich alloy. Again, in other embodiments, at least one of second layer 1708 and fourth layer 1712 may include a greater atomic percent Fe or a lesser atomic percent Fe, may include one or more additional elements, or may include an alloy of different elements. In some embodiments, at least one of second layer 1708 and fourth layer 1712 may include an alloy that is not a Fe-rich alloy, e.g., an alloy that includes less than approximately 50 at. % Fe. Additionally, while FIG. 17B illustrates second layer 1708 and fourth layer 1712 as including approximately the same composition, in other embodiments, second layer 1708 and fourth layer 1712 may include different compositions.

Third layer 1710 may include substantially only Fe, as shown in FIG. 17B. In other embodiments, third layer 1710 may include an alloy of Fe and Pt, may include another element, e.g., Pt-group, Co, Mn, or may include an alloy of at least two of Fe, Co, Mn, and a Pt-group element. As described above, in some embodiments, it may be desirable for third layer 1710 to have the highest magnetic moment, and thus include the highest atomic percent Fe. The atomic percent Fe in third layer may be greater than the atomic percent Fe in first layer 1706, second layer 1708, fourth layer 1712, and fifth layer 1714.

Similar to biasing magnet 1600 (FIG. 16), the layers of biasing magnet 1700 may be formed as substantially distinct, individual layers. For example, after formation, seed layer may include approximately 100 at. % Pt, as shown by line 1718, first layer 1706 may include a Pt-rich alloy represented by line 1720, and second layer 1708 may include a Fe-rich alloy represented by line 1722. Third layer 1710 may include approximately 100 at. % Fe, as shown by line 1724. Fourth layer 1712 may include a Fe-rich alloy represented by line 1726, fifth layer 1714 may include a Pt-rich alloy represented by line 1728, and cap layer 1716 may include approximately 100 at. % Pt.

After annealing, the composition of biasing magnet 1700 may be represented by line 1732. In particular, annealing biasing magnet 1700 may result in a composition profile that is blurred or smoothed compared to the composition profile of biasing magnet 1700 before annealing. As line 1732 illustrates, components of the individual layers 1702, 1706, 1708, 1710, 1712, 1714, and 1716 may diffuse to adjacent layers of biasing magnet 1700 during annealing. For example, a portion of the Fe in first layer 1706 may diffuse into seed layer 1702, and Pt in seed layer 1702 may diffuse into first layer 1706. Similar diffusion also may occur between other adjacent layers, e.g., between first layer 1706 and second layer 1708, between second layer 1708 and third layer 1710, and the like. Such diffusion may result in a smoother or blurred composition gradient, and may facilitate ordering of the atoms of the layers into an ordered crystal structure, such as an $L1_0$ phase structure. Although FIG. 17B shows a composition profile after annealing (line 1732) that includes rounded steps and is not completely smooth, in other embodiments, the composition profile may be smoother or less smooth than that shown in FIG. 17B. The particular composition profile after annealing may be a function of a number of parameters, including, for example, annealing time, annealing temperature, thickness of layers 1702, 1706, 1708, 1710, 1712, 1714, and 1716, the composition of layers 1702, 1706, 1708, 1710, 1712, 1714, and 1716, and the like. In any case, other composition profiles, both smoother and less smooth, are contemplated by this disclosure.

FIGS. 18A-18C illustrate an example of a biasing magnet 1800 that includes a multilayer stack 1804 between a seed layer 1802 and a cap layer 1816. In contrast to the examples illustrated in FIGS. 16A, 16B, 17A, and 17C, biasing magnet 1800 includes a compositional gradient that is asymmetric about a plane 1834 approximately equidistant from and substantially parallel to seed layer 1802 and cap layer 1816. A compositional gradient that is asymmetric about plane 1834 may facilitate control of the portion of biasing magnet 1800 that produces the greatest magnetic field strength. FIGS. 18B and 18C illustrate an example alignment of biasing magnet 1800 (FIG. 18B) and a read sensor 1828 (FIG. 18C).

As shown in FIGS. 18A and 18B, biasing magnet 1800 may include four layers below plane 1834: seed layer 1802, first layer 1806, second layer 1808, and third layer 1810. Biasing magnet 1800 also may include three layers, fourth layer 1812, fifth layer 1814, and cap layer 1816, above plane 1824. In some embodiments, seed layer 1802 and cap layer 1830 may include approximately 100 at % Pt, as illustrated in FIG. 18A by lines 1818 and 1830, respectively. In other embodiments, as described above, at least one of seed layer 1802 and cap layer 1830 may include another element, such as another Pt-group element, Fe, Co, Mn, or the like, or may include an alloy of at least two of these elements.

As FIG. 18A shows, each of the five layers 1806, 1808, 1810, 1812, and 1814 may include different compositions. In some embodiments, first layer 1806 may include an alloy of Pt and Fe and, more particularly, an alloy of Pt and Fe that includes a majority of Pt, e.g., a Pt-rich alloy, as represented by line 1820. In other embodiments, first layer 1806 may include a greater atomic percent Fe or a lesser atomic percent Fe that shown in FIG. 18A, may include one or more additional elements, or may include an alloy of different elements, e.g., an alloy of at least two of a Pt-group element, Fe, Mn, Co, or the like. In some embodiments, first layer 1806 may include Fe-rich alloy, i.e., an alloy including greater than approximately 50 at % Fe.

Line 1822 of FIG. 18A illustrates that second layer 1808 includes an alloy of Pt and Fe and, more particularly, an alloy of Pt and Fe that includes a greater atomic percent Fe than first layer 1808. Again, in other embodiments, second layer 1808 may include a greater atomic percent Fe or a lesser atomic percent Fe than shown in FIG. 18A, may include one or more additional elements, or may include an alloy of different elements. In some embodiments, second layer 1808 may include an alloy of a Pt-group element and Fe that includes a majority of Fe, e.g., a Fe-rich alloy.

Third layer 1810, represented by line 1824 in FIG. 18A, may include an alloy of Pt and Fe that includes a majority of Fe, as shown in FIG. 18A. In other embodiments, third layer 1810 may include an alloy of Fe and Pt including a greater percentage or lesser percentage of Fe (including a Pt-rich alloy), another element, e.g., another Pt-group element, Co, Mn, or an alloy of at least two of Fe, Co, Mn, and a Pt-group element. As FIG. 18A shows, first layer 1806, second layer 1808, and third layer 1810 may each be closer to seed layer 1802 than cap layer 1816. That is, first layer 1806, second layer 1808, and third layer 1810 may be located partially or fully below plane 1834, which is approximately equidistant from and parallel to seed layer 1802 and cap layer 1816.

Fourth layer 1812 may include substantially only Fe, as illustrated by line 1828 in FIG. 18A, or may include substantially only another element, such as a Pt-group metal, Co, Mn, or the like. In other embodiments, fourth layer 1812 may include an alloy of at least two of Fe, Co, Mn, and a Pt-group metal. In some embodiments, it may be desired that fourth layer 1812 has the largest magnetic moment of first layer 1806, second layer 1808, third layer 1810, fourth layer 1812, and fifth layer 1814. Accordingly, fourth layer 1812 may include the highest atomic percent Fe, or the highest atomic percent of another element that provides a high magnetic moment.

Fifth layer 1814 may include a lower percentage of Fe than fourth layer 1812. For example, as shown in FIG. 18A by line 1828, fifth layer 1814 may include an alloy of Pt and Fe including approximately 50 at. % Fe and 50 at. % Pt. In other embodiments, fifth layer 1814 may include a greater atomic percent Fe or lesser atomic percent Fe. For example, fifth layer 1814 may include a majority Fe, e.g., a Fe-rich alloy, or a majority Pt, e.g., a Pt-rich alloy. In other embodiments, fifth layer 1814 may include at least one other element, such as, for example, another Pt-group element, Co, Ir, Mn, or the like, or may include an alloy of at least two of Fe, Co, Ir, Mn, Fe, a Pt-group element, or the like.

At least one of the five layers 1806, 1808, 1810, 1812, and 1814 may be a different thickness than at least one other of the five layers 1806, 1808, 1810, 1812, and 1814. For example, as shown in FIGS. 18A and 18B, first layer 1806, second layer 1808, and third layer 1810 may be approximately the same thickness. FIGS. 18A and 18B also show fourth layer 1812 and fifth layer 1814 as being similar thicknesses. In other examples, each of the layers may be a different thickness, or each of the layers may be approximately the same thickness. In any case, as described above with respect to FIGS. 16A and 16B, each of the five layers 1706, 1708, 1710, 1712, and 1714 may have a thickness of up to approximately 50 Å. In other embodiments, each of the five layers 1706, 1708, 1710, 1712, and 1714 may have a thickness of between approximately 5 Å and approximately 30 Å, or between approximately 10 Å and approximately 15 Å.

Similar to biasing magnet 1600 (FIGS. 16A and 16B) and biasing magnet 1700 (FIGS. 17A and 17B), the layers of biasing magnet 1800 may be formed as substantially distinct, individual layers. For example, after formation, seed layer 1802 may include approximately 100 at. % Pt, as shown by line 1818, first layer 1806 may include a Fe—Pt alloy composition represented by line 1820, and second layer 1808 may include a Fe—Pt alloy composition represented by line 1822. Third layer 1810 may include a Fe—Pt alloy composition represented by line 1824, and fourth layer 1812 may include approximately 100 at. % Fe, as shown by line 1826. Fifth layer 1814 may include a Fe—Pt alloy composition represented by line 1828, and cap layer 1816 may include approximately 100 at. % Pt. After annealing, the composition of the biasing magnet 1800 may be represented by line 1832. In particular, annealing of biasing magnet 1800 may result in a composition profile that is blurred or smoothed compared to the composition profile of biasing magnet 1800 before annealing. As line 1832 illustrates, components of the individual layers 1802, 1806, 1808, 1810, 1812, 1814, and 1816 may diffuse to adjacent layers of biasing magnet 1800 during annealing. For example, a portion of the Fe in first layer 1806 may diffuse into seed layer 1802, and Pt in seed layer 1802 may diffuse into first layer 1806. Similar diffusion also may occur between other adjacent layers, e.g., first layer 1806 and second layer 1808, second layer 1808 and third layer 1810, and the like. Such diffusion may result in a smoother or blurred composition gradient, and may facilitate ordering of the atoms of the layers into an ordered crystal structure, such as an $L1_0$ phase structure. Although FIG. 18A shows a composition profile after annealing (line 1834) that includes rounded steps and is not completely smooth, in other embodiments, the composition profile may be more or less smooth than that shown in FIG. 18A. The particular composition profile after annealing may be a function of a number of parameters, including, for example, annealing time, annealing temperature, thickness of layers 1802, 1806, 1808, 1810, 1812, 1814, and 1816, the composition of layers 1802, 1806, 1808, 1810, 1812, 1814, and 1816, and the like. In any case, other composition profiles, both smoother and less smooth, are contemplated by this disclosure.

FIGS. 18B and 18C illustrate an alignment of a biasing magnet 1800 and an example of a read sensor 1838. Read sensor 1838 may be similar to tunneling magneto-resistive sensor 218 shown in FIG. 2. In particular, sensor 1838 may include an antiferromagnetic seed layer 1850, a pinned layer 1848, a reference layer 1846, a tunneling barrier layer 1844, a free layer 1842, and a cap layer 1840. As illustrated by FIGS. 18B and 18C, fourth layer 1812 of biasing magnet 1800 may substantially align with free layer 1842 of read sensor 1838. As described above, fourth layer 1812 may include the highest atomic percent Fe, and because of this, may have the highest magnetic moment. First layer 1806, second layer 1808, third layer 1810, and fifth layer 1814 may include a lower atomic percent Fe than fourth layer 1812, and may therefore have a lower magnet moment. By substantially aligning fourth layer 1812 with free layer 1842, the magnetic moment of fourth layer 1812 may bias the magnetic moment of free layer 1842 while not affecting the remaining layers of read sensor 1838 to as great of an extent. Additionally, the magnetic moments of seed layer 1802, first layer 1806, second layer 1808, third layer 1810, fifth layer 1814, and cap layer 1816 may be less than that of fourth layer 1812, and may affect the remaining layers of read sensor 1838 to a lesser extent than a layer having a magnetic moment similar to fourth layer 1812 would if positioned adjacent to the remaining layers of read sensor 1838. In this way, the construction of biasing magnet 1800 may reduce undesirable effects of the magnetic moment(s) of biasing magnet 1800 on layers of read sensor 1838 other than free layer 1842.

As FIGS. 18B and 18C show, fourth layer 1812 and free layer 1842 do not align precisely. For example, fourth layer 1812 is thicker than free layer 1842. In other embodiments, fourth layer 1812 and free layer 1842 may align more completely. For example, fourth layer 1812 and free layer 1842 may have approximately the same thickness. In other embodiments, fourth layer 1812 and free layer 1842 may align less precisely. For example, neither of the boundaries of fourth layer 1812 and free layer 1842 may align, and fourth layer 1812 and free layer 1842 may have different thicknesses.

While FIGS. 18A and 18B illustrate a biasing magnet 1800 including a multilayer stack 1804 having five layers 1806, 1808, 1810, 1812, and 1814 that include an asymmetric composition profile, in other embodiments, a biasing magnet may include fewer than five layers or more than five layers and have an asymmetric composition profile. For example, a biasing magnet may include four layers or six layers and may have an asymmetric composition profile. In addition, the alignment between biasing magnet 1800 and read sensor 1838 may be different from that shown in FIGS. 18B and 18C. For example, third layer 1810 and free layer 1842 may be approximately aligned, or fifth layer 1814 and free layer 1842 may be approximately aligned. Other alignments of biasing magnet 1800 and read sensor 1838 are apparent and are contemplated by the disclosure.

Figures 19A, 19B:
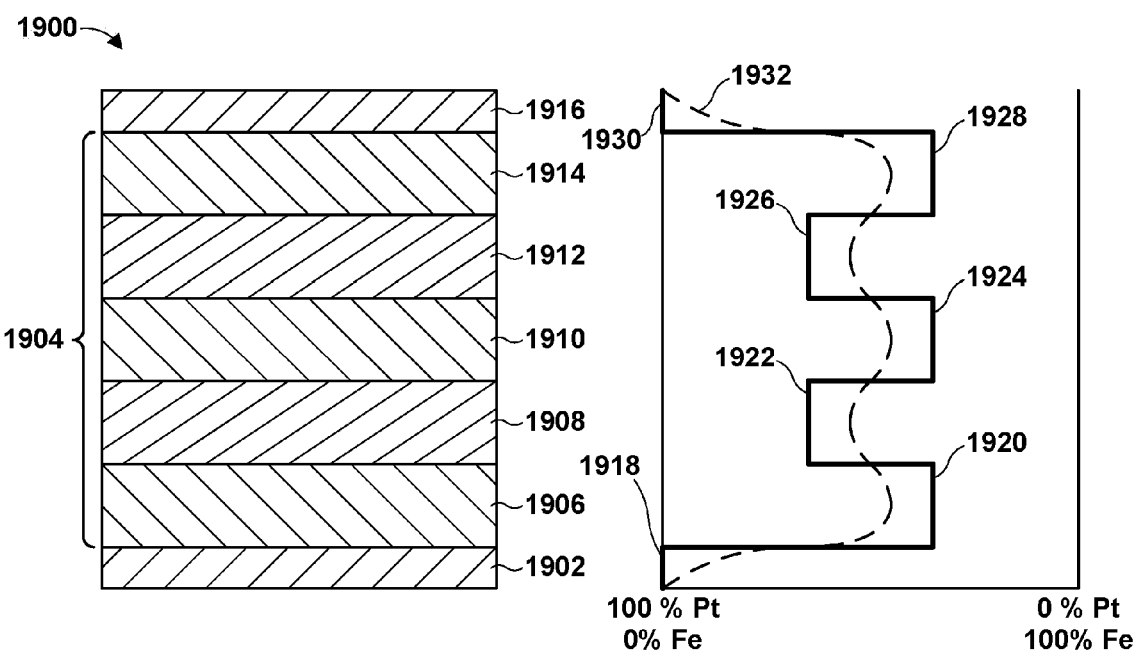
FIGS. 19A and 19B are a cross-sectional diagram and a plot of composition for an example multilayer hard magnet.

In some embodiments, a biasing magnet including a multilayer stack may not include a compositional gradient, but may instead include a compositional profile that is approximately uniform throughout the multilayer stack. For example, as shown in FIGS. 19A and 19B, a biasing magnet 1900 may include a seed layer 1902, a cap layer 1916 and a multilayer stack 1904 including five layers 1906, 1908, 1910, 1912, and 1914. FIGS. 19A and 19B show biasing magnet 1900 as including Pt and Fe. In other embodiments, biasing magnet 1900 may include Fe and another Pt-group elements, such as Pd, Ir, Rh, or Ru, or may include at least two of Co, Mn, Fe, and a Pt-group element.

In the illustrated embodiment, seed layer 1902 and cap layer 1916 each include approximately 100 at % Pt. In other embodiments, at least one of seed layer 1902 and cap layer 1916 may be formed of another Pt-group element, such as, for example, Pd, Ir, Rh, or Ru, may be formed of an alloy of two or more Pt-group elements, or may comprise at least one element in addition to or as an alternative to a Pt-group element. For example, at least one of seed layer 1902 and cap layer 1916 may comprise at least one of Mn, Co, Fe, or the like, in addition to or instead of a Pt-group element.

FIG. 19B shows first layer 1906, third layer 1910, and fifth layer 1914 as including an alloy of Pt and Fe and, more particularly, an alloy of Pt and Fe that includes a majority of Fe, e.g., a Fe-rich alloy. In other embodiments, at least one of first layer 1906, third layer 1910, and fifth layer 1914 may include a greater atomic percent Fe or a lesser atomic percent Fe, may include one or more additional elements, or may include an alloy of different elements, e.g., an alloy of at least two of a Pt-group element, Fe, Mn, Co, or the like. Additionally, while FIG. 19B illustrates first layer 1906, third layer 1910, and fifth layer 1914 as including approximately the same composition, in other embodiments, at least one of first layer 1906, third layer 1910, and fifth layer 1914 may include a different composition. In other embodiments, at least one of first layer 1906, third layer 1910, and fifth layer 1914 may include an alloy that includes a majority of Pt, i.e., a Pt-rich alloy.

FIG. 19B also illustrates second layer 1908 and fourth layer 1912 as including an alloy of Pt and Fe and, more particularly, an alloy of Pt and Fe that includes a majority of Pt, i.e., a Pt-rich alloy. Again, in other embodiments, at least one of second layer 1908 and fourth layer 1912 may include a greater atomic percent Fe or a lesser atomic percent Fe, may include one or more additional elements, or may include an alloy of different elements. In some embodiments, at least one of second layer 1908 and fourth layer 1912 may include an alloy that is not a Fe-rich alloy, e.g., an alloy that includes less than approximately 50 at. % Fe. Additionally, while FIG. 19B illustrates second layer 1908 and fourth layer 1912 as including approximately the same composition, in other embodiments, second layer 1908 and fourth layer 1912 may include different compositions.

Each of seed layer 1902, first layer 1906, second layer 1908, third layer 1910, fourth layer 1912, fifth layer 1914, and cap layer 1916 may include a composition different than the composition shown in FIG. 19B. For example, at least one of seed layer 1902, first layer 1906, second layer 1908, third layer 1910, fourth layer 1912, fifth layer 1914, and cap layer 1916 may include a greater atomic percent Fe or a lesser atomic percent Fe. The different composition of at least one of seed layer 1902, first layer 1906, second layer 1908, third layer 1910, fourth layer 1912, fifth layer 1914, and cap layer 1916 may result in a biasing magnet that has a different composition profile that biasing magnet 1900 before and/or after annealing.

Similar to biasing magnet 1600 (FIG. 16A), the layers of biasing magnet 1900 may be formed as substantially distinct, individual layers. For example, after formation, seed layer 1902 may include approximately 100 at. % Pt, as shown by line 1912, first layer 1906 may include a Fe-rich alloy composition represented by line 1920, and second layer 1908 may include a Pt-rich alloy composition represented by line 1922. Third layer 1910 may include a Fe-rich alloy, as shown by line 1924, fourth layer 1912 may include a Pt-rich alloy composition represented by line 1926, fifth layer 1914 may include a Fe-rich alloy composition represented by line 1928, and cap layer 1916 may include approximately 100 at. % Pt.

After annealing, the composition of biasing magnet 1900 may be represented by line 1932. In particular, annealing of biasing magnet 1900 may result in a composition profile that is blurred or smoothed compared to the composition profile of biasing magnet 1900 before annealing. As line 1932 illustrates, components of the individual layers 1902, 1906, 1908, 1910, 1912, 1914, and 1916 may diffuse to adjacent layers of biasing magnet 1900 during annealing. For example, a portion of the Fe in first layer 1906 may diffuse into seed layer 1902, and Pt in seed layer 1902 may diffuse into first layer 1906. Similar diffusion also may occur between other adjacent layers, e.g., first layer 1906 and second layer 1908, second layer 1908 and third layer 1910, and the like. Such diffusion may result in a smoother or blurred composition profile, and may facilitate ordering of the atoms of the layers into an ordered crystal structure, such as an $L1_0$ phase structure. Although FIG. 19B shows a composition profile after annealing (line 1932) that includes rounded steps and is not completely smooth, in other embodiments, the composition profile may be smoother or less smooth than that shown in FIG. 19B. The particular composition profile after annealing may be a function of a number of parameters, including, for example, annealing time, annealing temperature, thickness of layers 1902, 1906, 1908, 1910, 1912, 1914, and 1916, the composition of layers 1902, 1906, 1908, 1910, 1912, 1914, and 1916, and the like. In any case, other composition profiles, both smoother and less smooth, are contemplated by this disclosure.

In some embodiments, a biasing magnet may include a multilayer stack that includes more than five layers or fewer than five layers. In some embodiments, a multilayer stack including a greater number of layers may reduce a required annealing temperature to form an ordered phase structure compared to a multilayer stack with fewer layers.

Figure 20:
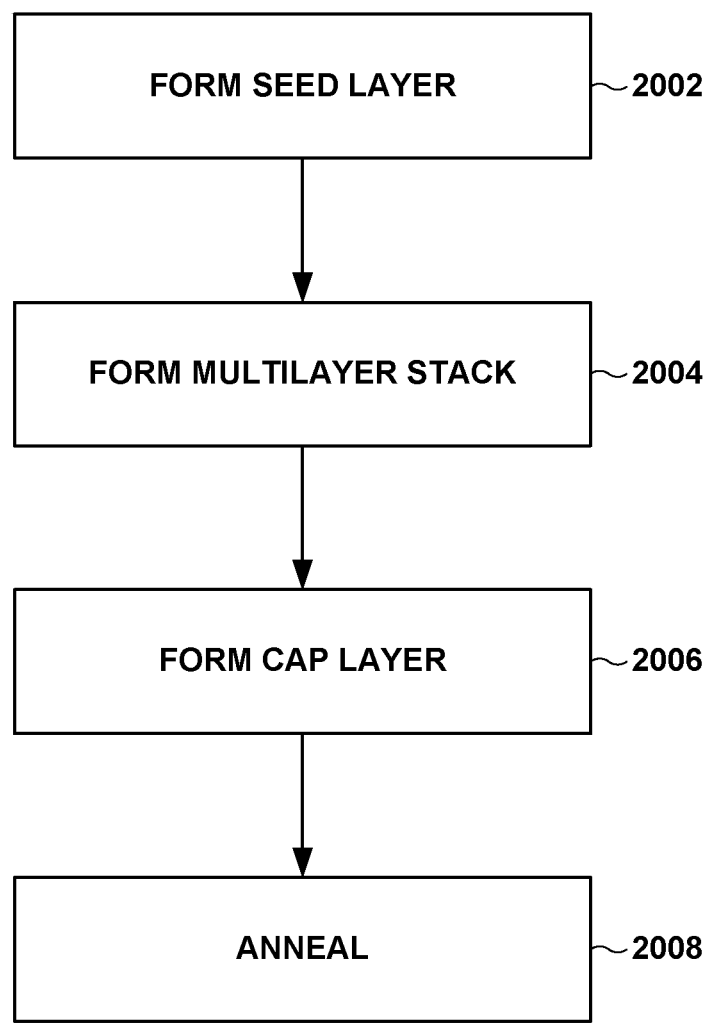
FIG. 20 is a flow diagram that shows an example method of forming a multilayer hard magnet.

FIG. 20 is a flow diagram of an example technique according to which a biasing magnet, e.g., biasing magnet 1600 (FIG. 16A), may be formed. First, seed layer 1602 may be formed (2002). Seed layer 1602 may be formed by any of a variety of techniques, including, for example, sputtering, ion beam deposition, chemical vapor deposition, physical vapor deposition, molecular beam epitaxy, laser ablation, and the like. Seed layer 1602 may be formed on a variety of substrates, such as, for example, insulating materials 222 or 223 (FIG. 2). As described above, seed layer 1602 may have a thickness of up to about up to about 200 Å, and in some embodiments, may have a thickness between approximately 25 Å and approximately 125 Å.

Multilayer stack 1604 then is formed over seed layer 1602 (2004). As described with respect to FIGS. 16A and 16B, multilayer stack 1604 may include two layers, three layers, or more than three layers. The layers in multilayer stack 1604 may comprise similar or different compositions. Each of the first layer 1606, second layer 1608, and third layer 1610 in multilayer stack 1604 may be formed individually, and each layer 1606, 1608, 1610 may be formed by, for example, sputtering, ion beam deposition, chemical vapor deposition, physical vapor deposition, molecular beam epitaxy, laser ablation, and the like. First layer 1606, second layer 1608, and third layer 1610 each may have a thickness of up to approximately 50 Å. In some embodiments, at least one of first layer 1606, second layer 1608, and third layer 1610 may have a thickness of between approximately 5 Å and approximately 30 Å, and in other embodiments, at least one of first layer 1606, second layer 1608, and third layer 1610 may have a thickness between approximately 5 Å and approximately 15 Å.

Once the layers of multilayer stack 1604 have been formed, cap layer 1612 may be formed over multilayer stack 1604 (2006). Cap layer 1612 may be formed by, for example, sputtering, ion beam deposition, chemical vapor deposition, physical vapor deposition, molecular beam epitaxy, laser ablation, and the like. As described above, cap layer 1612 may have a thickness of up to about up to about 200 Å, and in some embodiments, may have a thickness between approximately 25 Å and approximately 125 Å.

Finally, biasing magnet 1600 may be annealed (2008). For example, biasing magnet 1600 may be annealed at a temperature in the range from about 200° C. to about 500° C. for up to about 6 hours. In some embodiments, biasing magnet 1600 may be annealed at a temperature of about 200° C. to about 300° C., or approximately 280° C. In some embodiments, the annealing may be for approximately 4 hours. Annealing of biasing magnet 1600 may facilitate diffusion of at least one component between adjacent layers of biasing magnet 1600. Such diffusion may facilitate formation of the ordered phase, e.g., $L1_0$ ordered phase. Such diffusion may also result in a more uniform composition, e.g., FIGS. 19A and 19B, or may result in a smoother compositional gradient, e.g., FIGS. 16A, 16B, 17A, 17B, 18A, and 18B.

EXAMPLE

Figure 21:
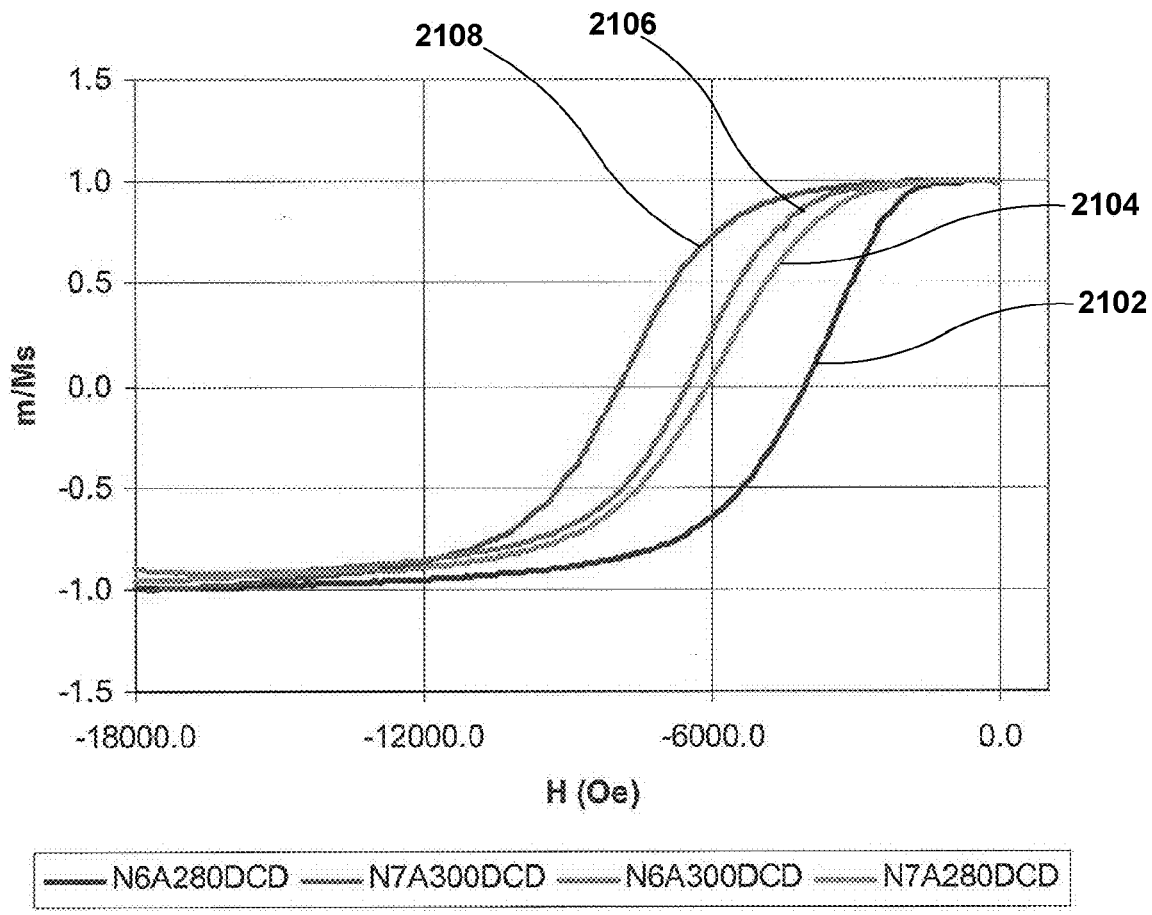
FIG. 21 is a plot of magnetic moment versus magnetic field for iron-platinum hard magnets.

FIG. 21 is a plot of magnetic moment versus magnetic field for four different iron-platinum hard magnets. Curve 2102 represents the remnant coercivity of a hard magnet including a Pt seed layer, a Fe-rich FePt alloy intermediate layer, and a Pt cap layer, which was annealed at approximately 280° C. Curve 2104 represents the remnant coercivity of a hard magnet including a 10 Å Pt seed layer, a 10 Å layer including 40 at. % Fe and 60 at. % Pt, a 150 Å layer including 65 at. % Fe and 35 at. % Pt, a 10 Å layer including 40 at. % Fe and 60 at. % Pt, and a 10 Å Pt cap layer, which was annealed at approximately 280° C. Curve 2106 represents the remnant coercivity of a hard magnet including a Pt seed layer, a Fe-rich FePt alloy intermediate layer, and a Pt cap layer, which was annealed at approximately 300° C. Curve 2108 represents the remnant coercivity of a hard magnet including a 10 Å Pt seed layer, a 10 Å layer including 40 at. % Fe and 60 at. % Pt, a 150 Å layer including 65 at. % Fe and 35 at. % Pt, a 10 Å layer including 40 at. % Fe and 60 at. % Pt, and a 10 Å Pt cap layer, which was annealed at approximately 300° C.

As FIG. 21 shows, the hard magnet represented by curve 2108 had a remnant coercivity that was about 1400 Oe greater than the remnant coercivity of the hard magnet represented by curve 2106. This demonstrates that, when annealed at approximately the same temperature, the multilayer stack may result in a hard magnet having a greater remnant coercivity than a hard magnet including a single intermediate layer.

Curves 2104 and 2106 illustrate that the hard magnet including a multilayer stack annealed at a temperature of approximately 280° C. may have a remnant coercivity comparable to the remnant coercivity of a hard magnet having a single intermediate layer annealed at approximately 300° C. Accordingly, comparison of curves 2104 and 2106 demonstrate that the chemical ordering temperature may be reduced by utilizing a multilayer stack between the seed layer and the cap layer.

Various embodiments of the invention have been described. The implementations described above and other implementations are within the scope of the following claims.

The invention claimed is:

1. A hard magnet comprising:
   a seed layer comprising a first component comprising at least one of a Pt-group metal;
   a cap layer comprising the first component; and
   a multilayer stack between the seed layer and the cap layer, wherein the multilayer stack comprises
      a first layer comprising a first alloy of the first component and Fe,
      a second layer formed over the first layer and comprising Fe, and
      a third layer formed over the second layer, the third layer comprising a third alloy of the first component and Fe,
      wherein both the first alloy and the third alloy comprise lower atomic percent of Fe than the second layer, and
   wherein the hard magnet is an in-plane magnet.

2. The hard magnet of claim 1, wherein the Pt-group metal comprises Pt.

3. The hard magnet of claim 1, wherein the multilayer stack further comprises
   a fourth layer formed over the first layer and
   a fifth layer formed over the fourth layer,
   wherein the fourth layer comprises a fourth alloy of Fe and the first component and the fourth alloy comprises an atomic percent of Fe that is greater than the first alloy and lower that the second layer, and
   wherein the fifth layer comprises a fifth alloy of Fe and the first component and the fifth alloy comprises an atomic percent of Fe that is greater than the fourth alloy.

4. The hard magnet of claim 1, wherein a composition profile of the hard magnet is substantially symmetric about a plane approximately equidistant from and substantially parallel to the seed layer and the cap layer.

5. The hard magnet of claim 1, wherein a composition profile of the hard magnet is asymmetric about a plane approximately equidistant from and substantially parallel to the seed layer and the cap layer.

6. The hard magnet of claim 1, wherein at least one of the first layer, the second layer, and the third layer comprises a thickness of between approximately 10 Å and approximately 15 Å.

7. The hard magnet according to claim 1, wherein the in-plane hard magnet has an in-plane coercvivity of greater than or equal to about 1300 Oe.

8. A read/write head for a data storage device, the head comprising:
   a hard magnet comprising
      a seed layer comprising a Pt-group metal,
      a cap layer comprising the Pt-group metal, and
      a multilayer stack between the seed layer and the cap layer, wherein the multilayer stack comprises
         a first layer comprising a first alloy of Fe and a Pt-group metal,
         a second layer comprising Fe formed over the first layer, and
         a third layer comprising a third alloy of Fe and the Pt-group metal formed over the second layer,
         wherein both the first alloy and the third alloy comprise lower atomic percent of Fe than the second layer,
      wherein the hard magnet is an in-plane magnet.

9. The read/write head of claim 8, wherein at least one of the first layer, the second layer, and the third layer comprises a thickness of up to approximately 50 Å.

10. The read/write head of claim 8, wherein at least one of the first layer, the second layer, and the third layer comprises a thickness of between approximately 10 Å and approximately 15 Å.

11. The read/write head of claim 8, further comprising a read sensor comprising a free layer, wherein the second layer is approximately aligned with the free layer.

12. The read/write head of claim 8, wherein the multilayer stack further comprises a fourth layer formed over the first layer and a fifth layer formed over the fourth layer, wherein the fourth layer comprises a fourth alloy of Fe and the Pt-group metal and the alloy comprises an atomic percent of Fe that is greater than the first alloy and lower that the second layer, and wherein the fifth layer comprises a fifth alloy of Fe and the Pt-group metal and the alloy comprises an atomic percent of Fe that is greater than the fourth alloy.

13. The read/write head of claim 12, further comprising a read sensor comprising a free layer, wherein the second layer is approximately aligned with the free layer.

14. The read/write head of claim 8, wherein a composition profile of the hard magnet is substantially symmetric about a plane approximately equidistant from and substantially parallel to the seed layer and the cap layer.

15. The read/write head of claim 8, wherein a composition profile of the hard magnet is asymmetric about a plane approximately equidistant from and substantially parallel to the seed layer and the cap layer.

16. A method comprising:
   forming a seed layer comprising a first component comprising at least one of a Pt group metal;
   forming a multilayer stack over the seed layer, wherein the multilayer stack comprises
      a first layer comprising a first alloy of the first component and Fe,
      a second layer formed over the first layer and comprising Fe, and
      a third layer formed over the second layer, the third layer comprising a third alloy of the first component and Fe,
      wherein the first and third alloy comprise a lower atomic percent of Fe than the second layer; and forming a cap layer over the multilayer stack, wherein the cap layer comprises the first component; and heating the seed layer, the multilayer stack, and the cap layer to an annealing temperature to cause interdiffusion between adjacent layers of the seed layer, the multilayer stack, and the cap layer.

17. The method of claim 16, wherein heating the multilayer structure to an annealing temperature comprises heating the multilayer structure to between approximately 250° C. and approximately 300° C.

* * * * *